United States Patent
Lo et al.

(10) Patent No.: US 11,805,342 B2
(45) Date of Patent: Oct. 31, 2023

(54) SOUND PRODUCING PACKAGE STRUCTURE AND MANUFACTURING METHOD THEREOF

(71) Applicant: xMEMS Labs, Inc., Santa Clara, CA (US)

(72) Inventors: Chiung C. Lo, San Jose, CA (US); Hsien-Ken Liao, Taichung (TW); Martin George Lim, Hillsborough, CA (US)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 17/348,773

(22) Filed: Jun. 16, 2021

(65) Prior Publication Data

US 2021/0314688 A1     Oct. 7, 2021

Related U.S. Application Data

(63) Continuation-in-part of application No. 16/699,078, filed on Nov. 28, 2019, now abandoned.

(60) Provisional application No. 63/051,909, filed on Jul. 15, 2020, provisional application No. 62/903,914, filed on Sep. 22, 2019.

(51) Int. Cl.
| | |
|---|---|
| *H04R 1/02* | (2006.01) |
| *H04R 3/00* | (2006.01) |
| *H04R 31/00* | (2006.01) |
| *H04R 7/04* | (2006.01) |

(52) U.S. Cl.
CPC ............ *H04R 1/025* (2013.01); *H04R 1/023* (2013.01); *H04R 3/00* (2013.01); *H04R 7/04* (2013.01); *H04R 31/006* (2013.01)

(58) Field of Classification Search
CPC .. H04R 2201/003; H04R 1/025; H04R 1/023; H04R 3/00; H04R 7/04; H04R 31/006
See application file for complete search history.

(56) References Cited

U.S. PATENT DOCUMENTS

| | | | |
|---|---|---|---|
| 7,763,488 B2 | 7/2010 | Goodelle | |
| 8,336,191 B1 | 12/2012 | Byers | |
| 9,241,221 B2 | 1/2016 | Wei | |
| 9,648,427 B2 | 5/2017 | Chi | |

(Continued)

FOREIGN PATENT DOCUMENTS

| | | |
|---|---|---|
| CN | 103747399 A | 4/2014 |
| CN | 103841501 A | 6/2014 |

(Continued)

OTHER PUBLICATIONS

Wikipedia, Microelectromechanical Systems, Dec. 2017, https://en.wikipedia.org/wiki/Microelectromechanical_systems.

*Primary Examiner* — Mark Fischer
(74) *Attorney, Agent, or Firm* — Winston Hsu

(57) ABSTRACT

A sound producing package structure includes a shell and a chip. The shell includes a top structure, a bottom structure and a sidewall structure. The chip is disposed inside the shell and configured to produce an acoustic wave, wherein the chip includes a thin film structure and an actuator configured to actuate the thin film structure, and the thin film structure is substantially parallel to the top structure and the bottom structure. A first opening is formed on the sidewall structure, and the acoustic wave propagates outwards through the first opening.

20 Claims, 18 Drawing Sheets

(56) References Cited

U.S. PATENT DOCUMENTS

| | | |
|---|---|---|
| 10,419,841 B2 | 9/2019 | Sibbald |
| 10,433,067 B2 | 10/2019 | Kaplan |
| 10,609,474 B2 | 3/2020 | Liang |
| 10,715,926 B2 | 7/2020 | Bretthauer |
| 2007/0147650 A1 | 6/2007 | Lee |
| 2008/0168887 A1 | 7/2008 | Takegawa |
| 2009/0001553 A1 | 1/2009 | Pahl |
| 2009/0034773 A1 | 2/2009 | Song |
| 2009/0101998 A1 | 4/2009 | Yen |
| 2010/0119097 A1 | 5/2010 | Ohtsuka |
| 2010/0167799 A1 | 7/2010 | Makihata |
| 2010/0284553 A1 | 11/2010 | Conti |
| 2011/0038495 A1 | 2/2011 | Jeong |
| 2011/0062573 A1 | 3/2011 | Zhe |
| 2011/0064247 A1* | 3/2011 | Ickler .................. H04R 1/30 381/117 |
| 2011/0085684 A1 | 4/2011 | Kim |
| 2011/0198714 A1 | 8/2011 | Yang |
| 2012/0018244 A1 | 1/2012 | Robert |
| 2012/0027234 A1* | 2/2012 | Goida .................. H04R 1/04 381/150 |
| 2012/0087522 A1 | 4/2012 | Lee |
| 2012/0207332 A1* | 8/2012 | Dehe .................. H04R 1/403 381/182 |
| 2013/0140655 A1 | 6/2013 | Yeh |
| 2013/0193533 A1 | 8/2013 | Vos |
| 2014/0103464 A1* | 4/2014 | Bolognia .................. H04R 1/04 257/E21.705 |
| 2014/0177881 A1 | 6/2014 | Fanget |
| 2015/0321906 A1 | 11/2015 | Tsai |
| 2016/0219377 A1 | 7/2016 | Chi |
| 2016/0345106 A1 | 11/2016 | Pahl |
| 2017/0006368 A1* | 1/2017 | Brioschi .............. B81B 7/0061 |
| 2017/0041717 A1 | 2/2017 | Zou |
| 2017/0041719 A1* | 2/2017 | Zou .................. H04R 31/00 |
| 2017/0048624 A1 | 2/2017 | Clerici |
| 2017/0230756 A1 | 8/2017 | Schelling |
| 2017/0276646 A1 | 9/2017 | Moreira Araujo |
| 2017/0320726 A1* | 11/2017 | Leitgeb ................ B81B 7/0061 |
| 2018/0041828 A1 | 2/2018 | Sibbald |
| 2018/0139543 A1 | 5/2018 | Clerici |
| 2018/0213312 A1 | 7/2018 | Hsiao |
| 2018/0213332 A1 | 7/2018 | Kaplan |
| 2018/0343524 A1 | 11/2018 | Lim |
| 2019/0045307 A9 | 2/2019 | Kaplan |
| 2019/0116417 A1 | 4/2019 | Liang |
| 2019/0141435 A1 | 5/2019 | Lo |
| 2019/0145806 A1 | 5/2019 | Lim |
| 2019/0208330 A1 | 7/2019 | Bretthauer |
| 2019/0241429 A1* | 8/2019 | Suvanto ................ B81B 7/0032 |
| 2019/0289405 A1 | 9/2019 | Littrell |
| 2020/0075839 A1* | 3/2020 | Sooriakumar ........ H01L 41/053 |
| 2021/0009407 A1 | 1/2021 | Yoo |

FOREIGN PATENT DOCUMENTS

| | | |
|---|---|---|
| CN | 204408626 U | 6/2015 |
| CN | 107108203 A | 8/2017 |
| CN | 107690102 A | 2/2018 |
| CN | 107852555 A | 3/2018 |
| CN | 109688529 A | 4/2019 |
| CN | 110012392 A | 7/2019 |
| DE | 10 2011 004 570 A1 | 8/2012 |
| DE | 10 2017 223 869 A1 | 7/2019 |
| GB | 2538432 A | 11/2016 |
| JP | 2002-159083 A | 5/2002 |
| JP | 2002-263573 A | 9/2002 |
| JP | 2010-283451 A | 12/2010 |
| JP | 2018-170697 A | 11/2018 |
| KR | 10-2011-0039815 A | 4/2011 |
| KR | 10-1158354 B1 | 6/2012 |
| KR | 10-1471084 B1 | 12/2014 |
| KR | 10-2016-0146952 A | 12/2016 |
| KR | 10-2017-0002547 A | 1/2017 |
| KR | 10-2018-0031744 A | 3/2018 |
| KR | 10-2019-0060158 A | 6/2019 |
| WO | 2020/121609 A1 | 6/2020 |

\* cited by examiner

SOUND PRODUCING PACKAGE STRUCTURE AND MANUFACTURING METHOD THEREOF

CROSS REFERENCE TO RELATED APPLICATIONS

This application claims the benefit of U.S. provisional application No. 63/051,909, filed on Jul. 15, 2020, and this application is a continuation-in-part (CIP) of U.S. patent application Ser. No. 16/699,078 filed on Nov. 28, 2019, which claims the benefit of U.S. provisional application No. 62/903,914, filed on Sep. 22, 2019. All of the above-referenced applications are incorporated herein by reference.

BACKGROUND OF THE INVENTION

1. Field of the Invention

The present invention relates to a sound producing package structure and a manufacturing method thereof, and more particularly, to a sound producing package structure and a manufacturing method thereof for protecting a chip configured to produce sound.

2. Description of the Prior Art

Since micro sound producing devices, such as MEMS (Micro Electro Mechanical System) microspeakers, can be widely used in various electronic devices due to their small size, micro sound producing devices are developed rapidly in recent years. For example, a MEMS microspeaker may use a thin film piezoelectric material as actuator and a thin single crystal silicon layer as membrane which are formed by at least one semiconductor process.

However, the micro sound producing devices need to be protected due to their small sizes and fragility structures. Therefore, it is necessary to provide a package structure to protect the micro sound producing devices.

SUMMARY OF THE INVENTION

It is therefore a primary objective of the present invention to provide a sound producing package structure for protecting a chip configured to produce sound, and to provide a manufacturing method of the sound producing package structure.

An embodiment of the present invention provides a sound producing package structure including a shell and a chip. The shell includes a top structure, a bottom structure and a sidewall structure. The chip is disposed inside the shell and configured to produce an acoustic wave, wherein the chip includes a thin film structure and an actuator configured to actuate the thin film structure, and the thin film structure is substantially parallel to the top structure and the bottom structure. A first opening is formed on the sidewall structure, and the acoustic wave propagates outwards through the first opening.

An embodiment of the present invention further provides a manufacturing method of a sound producing package structure. The manufacturing method includes: providing a bottom structure; disposing a chip on the bottom structure, wherein the chip configured to produce an acoustic wave includes a thin film structure and an actuator configured to actuate the thin film structure; and disposing a sidewall structure and a top structure on the bottom structure, wherein the top structure, the bottom structure and the sidewall structure form a shell. The chip is inside the shell, the thin film structure of the chip is substantially parallel to the top structure and the bottom structure, a first opening is formed on the sidewall structure, and the acoustic wave propagates outwards through the first opening.

Due to the present invention, the yield rate, the reliability and the uniformity of the sound producing package structure is enhanced, the adverse impact of the dust and/or the liquid on the component in the package structure is decreased, and the sound producing package structure is downsized.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
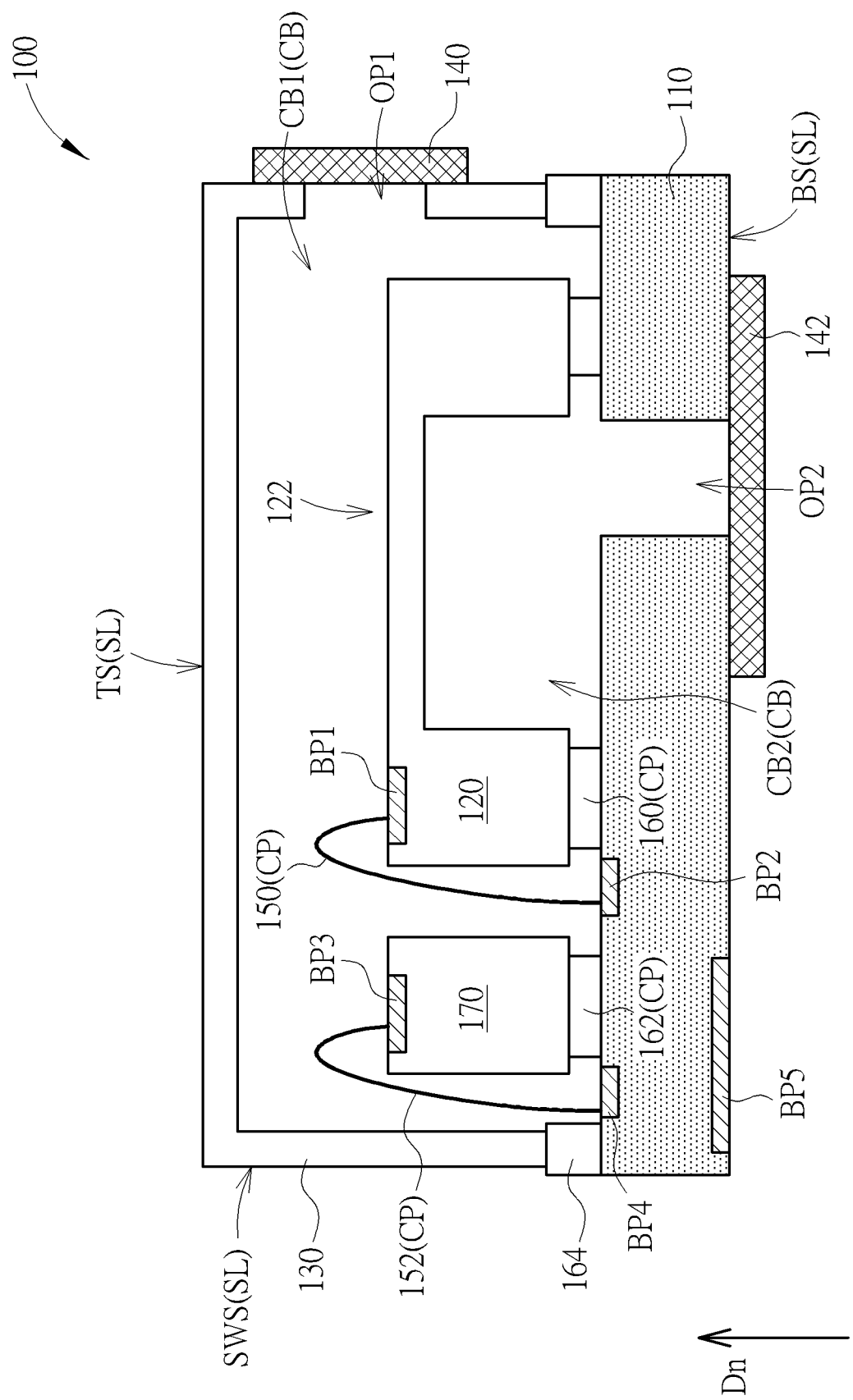
FIG. 1 is a schematic diagram of a cross-sectional view illustrating a sound producing package structure according to a first embodiment of the present invention.

To provide a better understanding of the present invention to those skilled in the art, preferred embodiments and typical material or range parameters for key components will be detailed in the follow description. These preferred embodiments of the present invention are illustrated in the accompanying drawings with numbered elements to elaborate on the contents and effects to be achieved. It should be noted that the drawings are simplified schematics, and the material and parameter ranges of key components are illustrative based on the present day technology, and therefore show only the components and combinations associated with the present invention, so as to provide a clearer description for the basic structure, implementing or operation method of the present invention. The components would be more complex in reality and the ranges of parameters or material used may evolve as technology progresses in the future. In addition, for ease of explanation, the components shown in the drawings may not represent their actual number, shape, and dimensions; details may be adjusted according to design requirements.

In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present invention, the corresponding features, areas, steps, operations and/or components would be pointed to existence, but not limited to the existence of one or a plurality of the corresponding features, areas, steps, operations and/or components.

When the corresponding component such as layer or area is referred to "on another component (or the variant thereof)", it may be directly on another component, or other component may exist between them. On the other hand, when the component is referred to "directly on another component (or the variant thereof)", any component does not exist between them. Furthermore, when a component A1 is disposed on a component A2, the component A1 may be situated on upper side, lower side, left side, right side or any other suitable side of the component A2.

It will be understood that when an element or layer is referred to as being "connected to" another element or layer, it can be directly connected to the other element or layer, or intervening elements or layers may be presented. In contrast, when an element is referred to as being "directly connected to" or "contact with" another element or layer, there are no intervening elements or layers presented.

In the following description and in the claims, when "a B1 component is formed by/of B2", B2 exist in the formation of B1 component or B2 is used in the formation of B1 component, and the existence and use of one or a plurality of other features, areas, steps, operations and/or components are not excluded in the formation of B1 component.

Although terms such as first, second, third, etc., may be used to describe diverse constituent elements, such constituent elements are not limited by the terms. The terms are used only to discriminate a constituent element from other constituent elements in the specification, and the terms do not relate to the sequence of the manufacture if the specification do not describe. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present invention.

Figure 2:
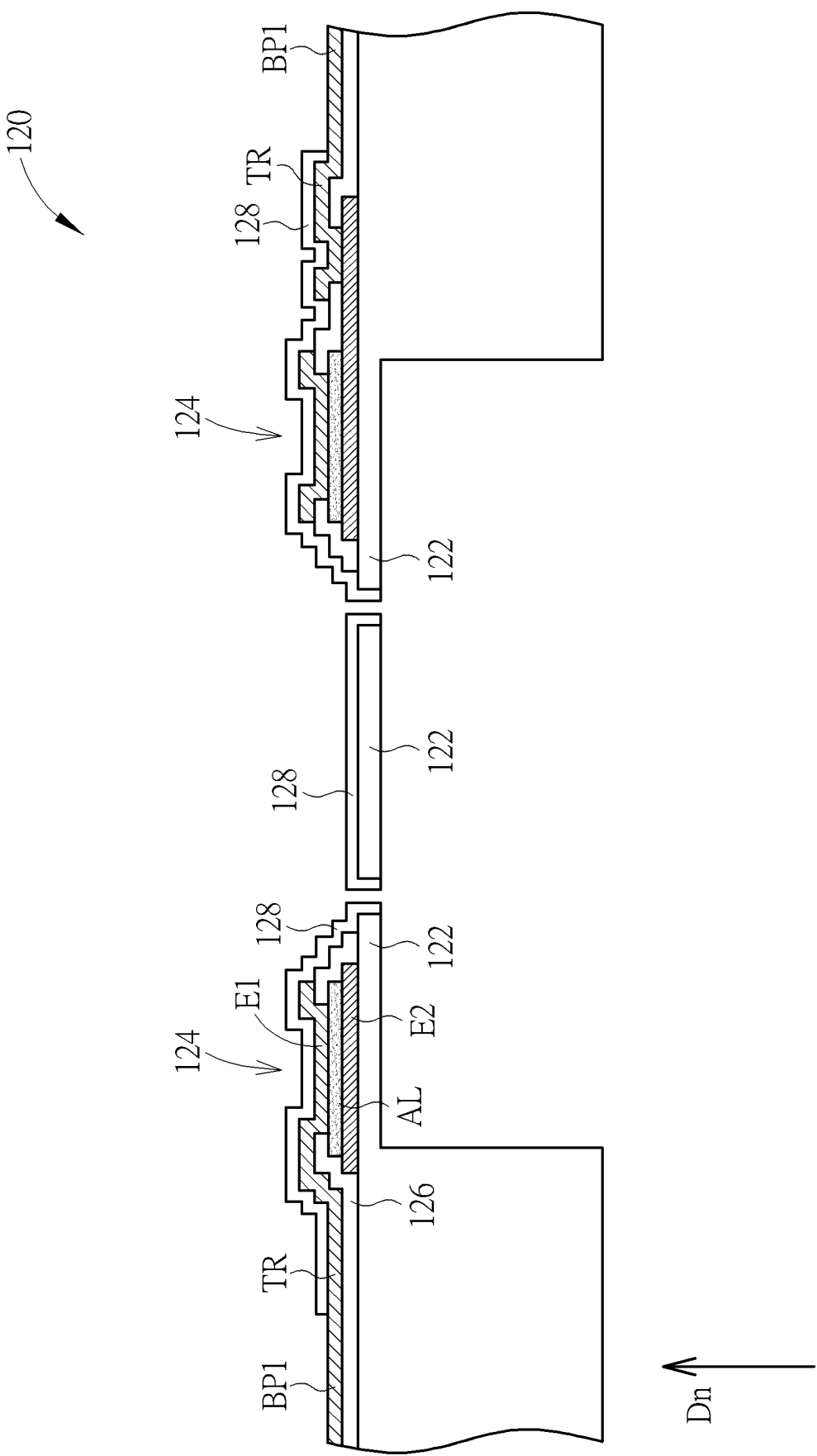
FIG. 2 is a schematic diagram of a cross sectional view of a chip according to an embodiment of the present invention.

Referring to FIG. 1 and FIG. 2, FIG. 1 is a schematic diagram of a cross-sectional view illustrating a sound producing package structure according to a first embodiment of the present invention, and FIG. 2 is a schematic diagram of a cross sectional view of a chip according to an embodiment of the present invention, wherein the chip shown in FIG. 2 is an exemplary structure. As shown in FIG. 1, the sound producing package structure 100 includes a shell SL and a chip 120 disposed inside the shell SL. The shell SL may include a top structure TS, a bottom structure BS and at least one sidewall structure SWS, wherein the bottom structure BS may be opposite to the top structure TS, and the sidewall structure SWS may be between the top structure TS and the bottom structure BS, such that the chip 120 is between the top structure TS and the bottom structure BS and surrounded by the sidewall structure(s) SWS. In this embodiment, the top structure TS and the bottom structure BS may be parallel to each other, but not limited thereto. As shown in FIG. 1, a top area of the top structure TS is larger than a side area of the sidewall structure SWS.

The shell SL may be assembled by a plurality of components. In some embodiments, the top structure TS may be formed of one or more component(s), the bottom structure BS may be formed of one or more component(s), and the sidewall structure(s) SWS may be formed of one or more component(s), but not limited thereto. In some embodiments, one component may serve as two or more of the top structure TS, the bottom structure BS and the sidewall structure SWS, but not limited thereto. For example, in FIG. 1, the shell SL may be formed of a base 110 and a cap 130 disposed on the base 110, wherein the base 110 may serve as the bottom structure BS, the cap 130 may serve as the sidewall structure(s) SWS and the top structure TS, and the cap 130 may be connected to the base 110 through at least one adhesive component 164, but not limited thereto.

In some embodiments, the base 110 may be a substrate or an integrated circuit chip. In detail, the substrate may be a hard substrate or a flexible substrate. Based on the type of the substrate, the substrate may include silicon, germanium, glass, plastic, quartz, sapphire, polymer, resin, polyimide (PI), polyethylene terephthalate (PET), other suitable material or a combination thereof, but not limited thereto. Optionally, at least one conductive layer (e.g., at least one metal layer), at least one insulating layer, at least one semiconductor layer or a combination thereof may be included in the substrate. For example, the substrate may be a circuit board including a laminate (e.g. copper clad laminate, CCL), a land grid array (LGA) board or any other suitable board containing conductive material, such that the substrate may include one or more conductive component(s), such as connecting trace(s), passive component(s) and/or bonding pad(s). The aforementioned integrated circuit chip may include a circuit having any suitable function. For instance, the integrated circuit chip may be an application-specific integrated circuit (ASIC) chip, but not limited thereto.

The cap 130 may be designed based on requirement(s). For example, as shown in FIG. 1, the cap 130 may be a one-piece structure, wherein a top part of the cap 130 may be the top structure TS of the shell SL, at least one sidewall of the cap 130 may be the sidewall structure(s) SWS of the shell SL, but not limited thereto. The cap 130 may include any suitable material, such as metal, glass, silicon, germanium, plastic, polymer or a combination thereof, but not limited thereto. In addition, the cap 130 may be formed by any suitable process, such as a semiconductor process, a patterning process, a molding process (such as injection molding process), a punching process, a stamping process, a bending process or a combination thereof.

The chip 120 may be disposed at any suitable position inside the shell SL. That is to say, the chip 120 may be disposed on the base 110, the cap 130 and the chip 120 may be on a same side of the base 110, and the chip 120 may be situated on a region inside the cap 130. Furthermore, as shown in FIG. 1, the chip 120 may be connected to the base 110 through at least one adhesive component 160 (i.e., one of connecting components CP), such that the chip 120 may be fixed on the base 110, but not limited thereto. In this embodiment, the adhesive component 160 may be between and in contact with the base 110 and the chip 120, but not limited thereto.

The chip 120 is configured to generate an acoustic wave. In detail, as shown in FIG. 1 and FIG. 2, the chip 120 may include a thin film structure 122 and an actuator 124, wherein the thin film structure 122 may face and/or be substantially parallel to the top part of the cap 130 (i.e., the top structure TS of the shell SL) and the base 110 (i.e., the bottom structure BS of the shell SL), and the actuator 124 is configured to actuate the thin film structure 122, so as to make the thin film structure 122 generate the acoustic wave. In the operation of the sound producing package structure 100, the acoustic wave is produced due to the movement of the thin film structure 122. For example, in FIG. 1 and FIG. 2, the thin film structure 122 may be actuated to move upwardly and downwardly by the actuator 124. In the present invention, the terms "move upwardly" and "move downwardly" represent that the thin film structure 122 moves substantially along a direction parallel to a normal direction of the thin film structure 122.

The thin film structure 122 includes any suitable material. In this embodiment, the thin film structure 122 may include silicon (e.g., single crystalline silicon or poly-crystalline silicon), silicon compound (e.g., silicon carbide, silicon oxide), germanium, germanium compound (e.g., gallium nitride or gallium arsenide), gallium, gallium compound, any other suitable material or a combination thereof, but not limited thereto.

The actuating method of the thin film structure 122 may be based on the type of the actuator 124. In some embodiments, the actuator 124 may include a piezoelectric actuator, an electrostatic actuator, an electromagnetic actuator or an electrothermal actuator. For example, as shown in FIG. 2, the actuator 124 of this embodiment may include a piezoelectric actuator, the piezoelectric actuator may contain such as two electrodes E1 and E2 and a piezoelectric material layer AL disposed between the electrodes E1 and E2, wherein the piezoelectric material layer AL may actuate the thin film structure 122 based on received driving signal(s) (e.g., driving voltage(s)) received by the electrodes E1 and E2, but not limited thereto. For example, in another embodiment, the actuator 124 may include an electromagnetic actuator (such as a planar coil), wherein the electromagnetic actuator may actuate the thin film structure 122 based on received driving signal(s) (e.g., driving current) and a magnetic field (i.e. the thin film structure 122 may be actuated by the electromagnetic force). For example, in still another embodiment, the actuator 124 may include an electrostatic actuator (such as conducting plate), wherein the electrostatic actuator may actuate the thin film structure 122 based on received driving signal(s) (e.g., driving voltage(s)) and an electrostatic field (i.e. the thin film structure 122 may be actuated by the electrostatic force). For example, in still another embodiment, the actuator 124 may include an electrothermal actuator (such as a heater), wherein the electro-thermal actuator may actuate the thin film structure 122 by the thermal stress or the thermal strain.

The chip 120 may use any suitable way to generate the acoustic wave. In some embodiments, the actuated frequency of the thin film structure 122 may be the same as the frequency of the acoustic wave (i.e., the driving signal and the acoustic wave have the same frequency), such that the chip 120 may produce a sound at the frequency of sound (i.e., the sound producing package structure 100 may generate the acoustic wave complying with the zero-mean-flow assumption of classic acoustic wave theorems), but not limited thereto.

In some embodiments, instead of producing a sound at the frequency of sound, the chip 120 may generate a series of air pulses at a pulse rate (i.e., the air pulses are generated with a pulse rate), where the pulse rate may be higher than a maximum human audible frequency. That is to say, the actuated frequency of the thin film structure 122 may be higher than the frequency of the acoustic wave (i.e., the frequency of the driving signal may be higher than the frequency of the acoustic wave). The air pulse represents a variation in air/sound pressure caused by the sound producing package structure 100 within a pulse cycle, where the pulse cycle is an inverse/reciprocal of the pulse rate. In other words, the air pulse is in terms of a sound pressure level (SPL). Note that the series/plurality of air pulses may be referred as an ultrasonic pulse array (UPA).

Figure 3:
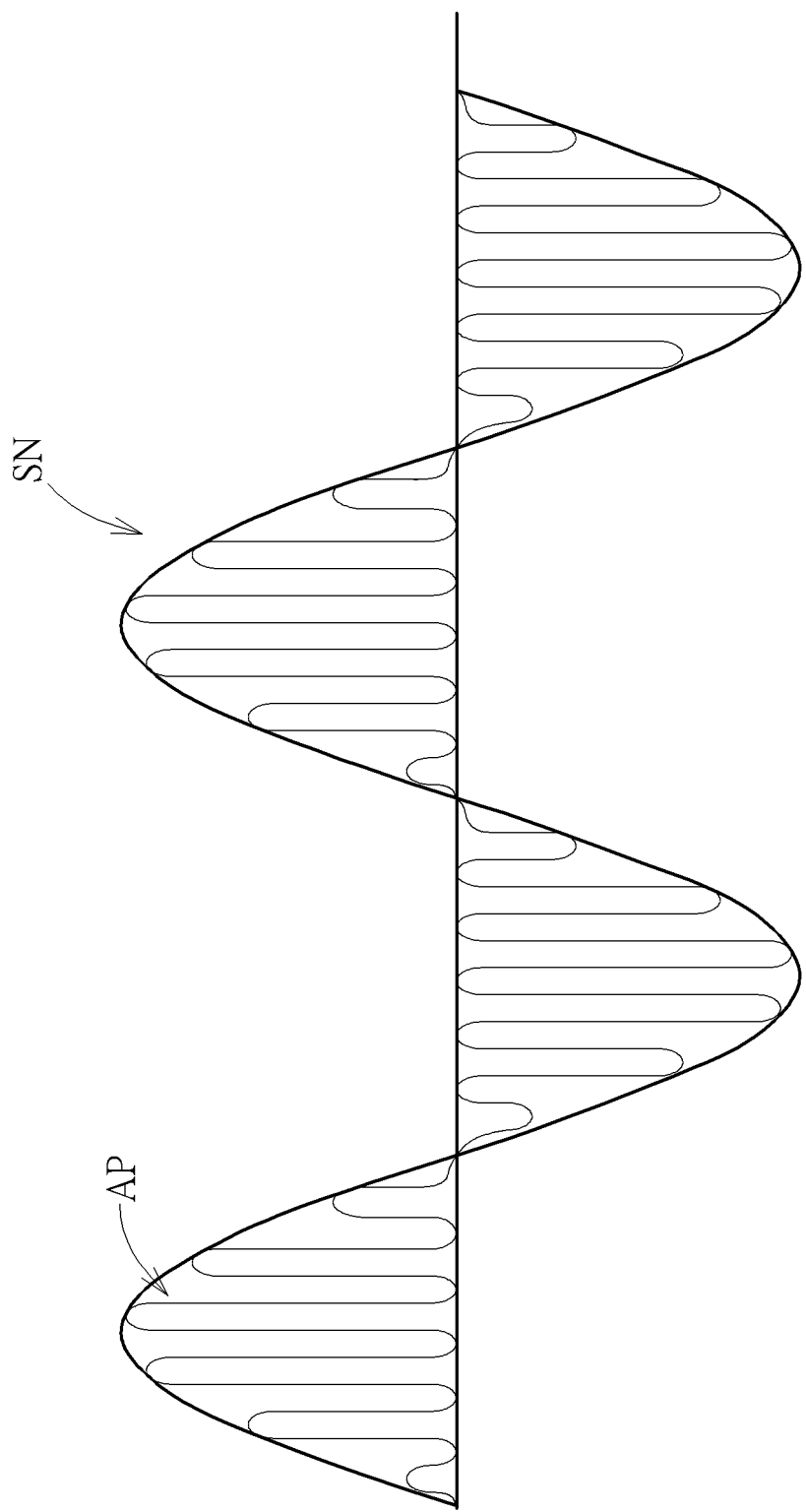
FIG. 3 is a schematic diagram of sound pressure levels of air pulses generated by a chip according to an embodiment of the present invention.

As an example, referring to FIG. 3, FIG. 3 is a schematic diagram of sound pressure levels of air pulses generated by a chip according to an embodiment of the present invention, wherein the acoustic wave SN shown in coarse line of FIG. 3 is a sinusoidal wave for example, and the air pulses AP are shown in fine line. The magnitude of the SPL of each air pulse AP are related to the magnitude of the corresponding time-sample of an input audio signal, wherein the input audio signal is corresponding to the acoustic wave SN desired to be generated, and the time-sample of the input audio signal represents an instantaneous value of the input audio signal sampled at a sampling time instant. In other words, one wave of the acoustic wave SN is reproduced by a plurality of air pulses AP. Furthermore, if the lengths of the pulse cycles of the air pulses AP are the same, the number of the air pulses AP reproducing one wave of the acoustic wave SN is decreased as the frequency of the acoustic wave SN is increased. In some embodiments, in order to make one wave of the acoustic wave SN be reproduced by the air pulses AP with the sufficient number, the pulse rate of the air pulses AP is higher than the maximum human audible frequency or higher than twice of the maximum human audible frequency (the maximum human audible frequency is generally considered to be 20 kHz), but not limited thereto. Furthermore, in some embodiments, according to Nyquist law, in order to avoid frequency spectral aliasing, the pulse rate needs to be at least twice higher than the maximum frequency of the acoustic wave SN.

The chip 120 may optionally include any other suitable component. For example, in FIG. 2, the chip 120 may optionally at least one conductive trace TR and at least one first bonding pad BP1, wherein the conductive trace TR may be electrically connected between the actuator 124 and the first bonding pad BP1, such that the driving signal provided from an outer device may be transmitted to the actuator 124 through the first bonding pad BP1 and the conductive trace TR, and the actuator 124 may actuate the thin film structure 122 based on the driving signal.

The position of the first bonding pad BP1 is related to the electrical connection between a second bonding pad BP2 of the base 110 and the chip 120. In some embodiments, as shown in FIG. 1 and FIG. 2, the upper side of the chip 120 may have the first bonding pad BP1, and a conductive wire 150 (i.e., another one of connecting components CP) is connected to (or in contact with) the first bonding pad BP1 of the chip 120 and the second bonding pad BP2 of the base 110, such that the driving signal may be transmitted to the chip 120 through the second bonding pad BP2, the conductive wire 150 and the first bonding pad BP1, but not limited thereto. In this case, the adhesive component 160 between the base 110 and the chip 120 may be not conductive, but not limited thereto. In this case, the conductive wire 150 may be formed by a wire bonding process, but not limited thereto.

Figure 16:
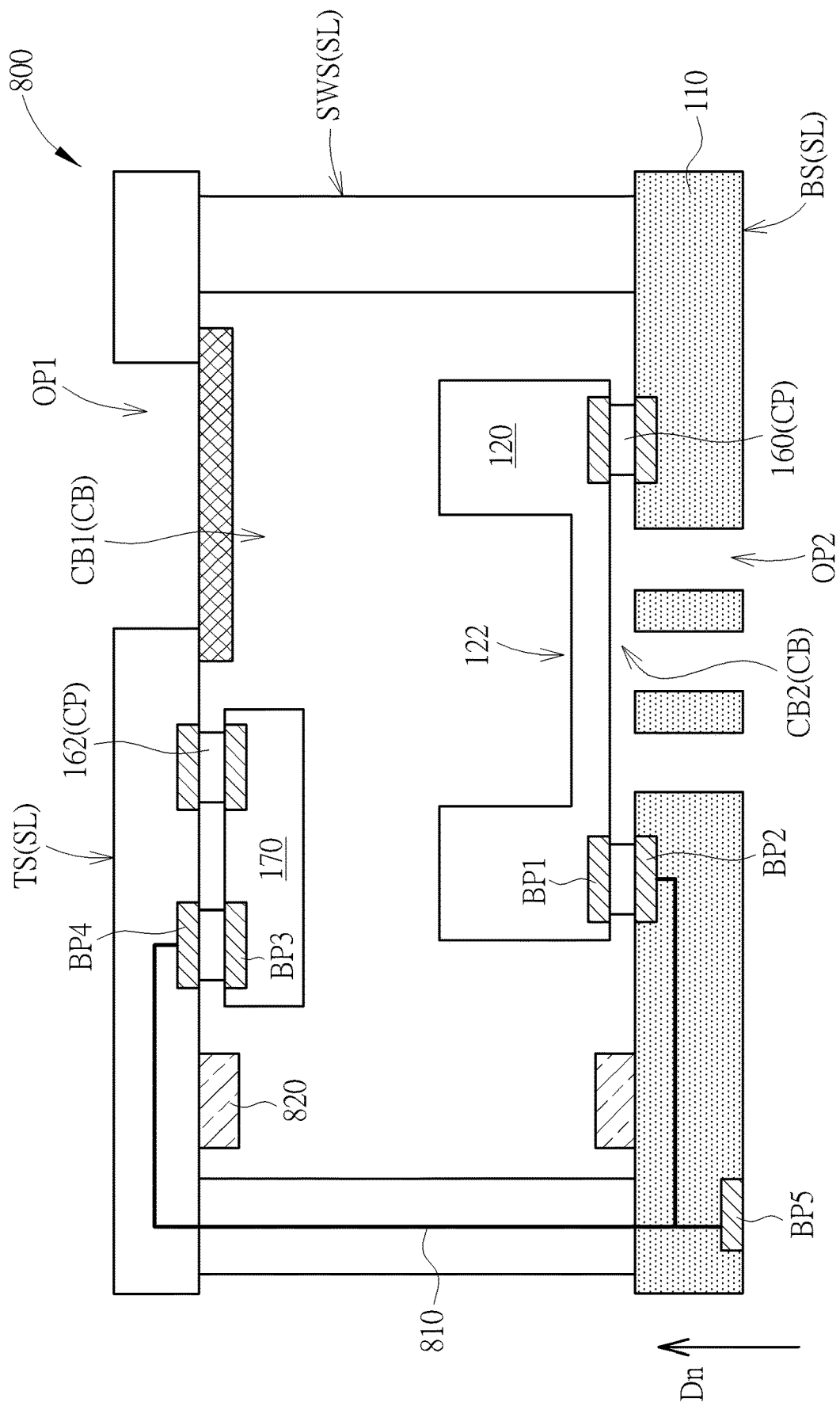
FIG. 16 is a schematic diagram of a cross-sectional view illustrating a sound producing package structure according to an eighth embodiment of the present invention.

In some embodiments (e.g., as shown in FIG. 16), the chip 120 may be disposed upside down, the adhesive component 160 is conductive, and the adhesive component 160 may be between and in contact with the first bonding pad BP1 of the chip 120 and the second bonding pad BP2 of the base 110 (e.g., a flip chip package), such that the driving signal may be transmitted to the chip 120 through the second bonding pad BP2, the adhesive component 160 and the first bonding pad BP1, but not limited thereto.

Furthermore, as shown in FIG. 2, the chip 120 may optionally include an insulating layer 126 and a protecting film 128, at least a portion of the insulating layer 126 may disposed between two conductive layers (such as two electrodes E1 and E2), and the protecting film 128 may cover at least one structure (such as the thin film structure 122 and/or the actuator 124) for protecting the covered structure(s). In FIG. 2, the first bonding pad BP1 may not be covered by the protecting film 128 for being connected to the conductive wire 150, but not limited thereto. Moreover, in some embodiments, the chip 120 may include any other suitable electronic component, and the conductive trace TR may be electrically connected to this electronic component.

In some embodiments, the structure of the chip 120 may be similar to the structure in U.S. application Ser. No. 16/125,761 or the structure in U.S. application Ser. No. 16/380,988 (these are proposed by the same applicant), and these contents are not narrated herein for brevity.

The chip 120 may be formed by any suitable manufacturing process. In this embodiment, the chip 120 may be formed by at least one semiconductor process and may include silicon, silicon germanium, silicon carbide, silicon on insulator (SOI), germanium on insulator (GOI), glass, gallium nitride, gallium arsenide, and/or other suitable compound. Note that since the thin film structure 122 of this embodiment is formed by at least one semiconductor process, the chip 120 may be such as a micro electro mechanical system (MEMS), but not limited thereto. Therefore, due to the semiconductor process, the size of the chip 120 (i.e., thickness and/or the lateral dimension) may be decreased. For example, the thickness of the chip 120 may range from 200 µm to 500 µm, but not limited thereto. In another embodiment, the manufacturing process may be similar to the process in U.S. application Ser. No. 16/380,988 (this content is not narrated herein for brevity), but not limited thereto.

The sound producing package structure 100 may optionally include an integrated circuit chip 170 disposed inside the shell SL or on the shell SL. In FIG. 1, the integrated circuit chip 170 may be disposed on the base 110 and inside the shell SL (i.e., the integrated circuit chip 170, the chip 120 and the cap 130 may be on the same side of the base 110), and the integrated circuit chip 170 does not overlap the chip 120 in a normal direction Dn of the base 110, but not limited thereto. Note that, in some embodiments, if the base 110 is also an integrated circuit chip, two integrated circuit chips may be stacked, but not limited thereto.

In FIG. 1, the integrated circuit chip 170 may be connected to the base 110 through at least one adhesive component 162 (i.e., another one of connecting components CP), such that the integrated circuit chip 170 may be fixed on the base 110, but not limited thereto. In this embodiment, the adhesive component 162 is between and in contact with the base 110 and the integrated circuit chip 170, but not limited thereto.

Similarly, the integrated circuit chip 170 may also include at least one third bonding pad BP3, and the signal provided from the outer device may be transmitted to the integrated circuit chip 170 through the third bonding pad BP3.

The position of the third bonding pad BP3 is related to the electrical connection between a fourth bonding pad BP4 of the base 110 and the integrated circuit chip 170. In some embodiments, as shown in FIG. 1, the upper side of the integrated circuit chip 170 may have the third bonding pad BP3, and a conductive wire 152 (i.e., another one of connecting components CP) is connected to (or in contact with) the third bonding pad BP3 of the integrated circuit chip 170 and the fourth bonding pad BP4 of the base 110, but not limited thereto. In this case, the adhesive component 162 between the base 110 and the integrated circuit chip 170 may be not conductive, but not limited thereto. In this case, the conductive wire 152 may be formed by a wire bonding process, but not limited thereto. On the other hand, in some embodiments, the integrated circuit chip 170 may be disposed upside down, the adhesive component 162 is conductive, and the adhesive component 162 is between and in contact with the third bonding pad BP3 of the integrated circuit chip 170 and the fourth bonding pad BP4 of the base 110 (e.g., a flip chip package), but not limited thereto.

Each of the adhesive components 160, 162, 164 may individually include an insulating adhesive material and/or a conductive adhesive material, and these adhesive components 160, 162, 164 may include the same material or different materials. For example, each of the adhesive components 160, 162, 164 may individually may include glue, epoxy, die attach film (DAF), dry film and/or solder, but not limited thereto. In this embodiment shown in FIG. 1, the adhesive components 160, 162, 164 are insulating and include insulating adhesive material, but not limited thereto.

Particularly, a chamber CB is formed in the shell SL. As shown in FIG. 1, the chamber CB may be formed of the base 110 and the cap 130, but not limited thereto. Moreover, in FIG. 1, the chip 120 and the integrated circuit chip 170 may be disposed in the chamber CB, and the chamber CB may be separated into a first portion CB1 and a second portion CB2 by the thin film structure 122 of the chip 120. For instance, in FIG. 1, the first portion CB1 may be between the thin film structure 122 and the top part of the cap 130 (i.e., the top structure TS of the shell SL), and the second portion CB2 may be between the thin film structure 122 and the base 110 (i.e., the bottom structure BS of the shell SL), but not limited thereto. In particular, the volume of the first portion CB1 and the volume of the second portion CB2 may be designed based on requirement(s), wherein the volume of the first portion CB1 and/or the volume of the second portion CB2 may affect the SPL of the acoustic wave.

In order to make the acoustic wave generated by the sound producing package structure 100 propagate outwards, the shell SL may have a first opening OP1 and a second opening OP2, wherein the first opening OP1 is connected to the first portion CB1 of the chamber CB, and the second opening OP2 is connected to the second portion CB2 of the chamber CB. In particular, in the first opening OP1 and the second opening OP2, one of them may serve as a sound outlet opening configured to propagate the acoustic wave outwards, another of them may serve as a back opening. Namely, the acoustic wave generated by the sound producing package structure 100 may propagate outwards through one of the first opening OP1 or the second opening OP2.

In this embodiment, the first opening OP1 may be formed on the sidewall structure SWS of the shell SL (i.e., the sidewall of the cap 130). As shown in FIG. 1, the side area of the sidewall structure SWS which is smaller than the top area of the top structure TS has the first opening OP1. In this embodiment, the second opening OP2 may be at a suitable position of the shell SL. For example, the bottom structure BS of the shell SL (i.e., the base 110) may have the second opening OP2, and the thin film structure 122 of the chip 120 may overlap the second opening OP2 in the normal direction Dn of the base 110, but not limited thereto. In addition, the size of the first opening OP1 and the size of the second opening OP2 may be designed based on requirement(s), and the number of the first opening(s) OP1 and the number of the second opening(s) OP2 may be designed based on requirement(s). For instance, in FIG. 1, the shell SL may have one first opening OP1 and one second opening OP2, but not limited thereto.

The position of the sound outlet opening may be determined based on the design of the speaker and other requirement(s). In some embodiments, as shown in FIG. 1, if the acoustic wave generated by the sound producing package structure 100 propagates outwards through the first opening OP1 (i.e., the first opening OP1 may serve as the sound outlet opening), the propagating direction of the acoustic wave in the first opening OP1 may be not parallel to the moving direction of the thin film structure 122. For example, the propagating direction of the acoustic wave in the first opening OP1 may be perpendicular to the moving direction of the thin film structure 122, but not limited thereto. In some embodiments, as shown in FIG. 1, the acoustic wave generated by the sound producing package structure 100 may propagate outwards through the second opening OP2 (i.e., the second opening OP2 may serve as the sound outlet opening), but not limited thereto.

Moreover, in order to reduce the adverse impact of the dust and/or the liquid (such as water) on the chip 120 and/or other structures of the sound producing package structure 100 (such as the conductive wires 150, 152), the sound producing package structure 100 may optionally include a first mesh 140 covering the first opening OP1 and outside the shell SL. Therefore, the dust and the liquid are hard to enter the sound producing package structure 100 through the first opening OP1. Furthermore, the sound producing package structure 100 may optionally include a second mesh 142 covering the second opening OP2 and outside the shell SL, such that the dust and the liquid are hard to enter the sound producing package structure 100 through the second opening OP2. In some embodiments, the first mesh 140 and the second mesh 142 may reduce the liquid infiltration due to the design of the surface tension, but the reducing method of the liquid infiltration is not limited thereto. In addition, since the first mesh 140 and the second mesh 142 have a plurality of mesh holes (or pores), such that the acoustic wave may propagate outwards through the opening and the mesh holes.

Furthermore, the first mesh 140 and the second mesh 142 may include any suitable material which is easy to be patterned and/or to be connected to other structure (i.e., the cap 130, the chip 120 or the base 110), such as metal, glass, semiconductor material (e.g., silicon and/or germanium), plastic, fabric, polymer or any combination thereof, but not limited thereto. For example, the first mesh 140 and the second mesh 142 may be made of polyester monofilament fibers, and the polyester monofilament fibers are woven with uniform pore size thereby creating consistent acoustic resistance, wherein the pore size as small as tens micrometer is typical to prevent the penetration of dust and the liquid. Moreover, the first mesh 140 and the second mesh 142 may be formed by any suitable process, such as at least one semiconductor process, at least one patterning process and/or at least one molding process, but not limited thereto.

The sound producing package structure 100 may further include any other required component. For instance, the lower side of the base 110 may have at least one fifth bonding pad BP5, wherein the fifth bonding pad BP5 may be connected to the outer device (such as an outer signal source) through an outer-conductive component, but not limited thereto. In this embodiment, the fifth bonding pad BP5 may be electrically connected to the second bonding pad BP2 and the fourth bonding pad BP4 through such as at least one trace (not shown in FIG. 1) in the base 110, such that the actuator 124 of the chip 120 may receive the signal from the outer device.

For another instance, in some embodiments, the sound producing package structure 100 may further include a protecting structure covering the conductive wires 150, 152. Thus, the conductive wires 150, 152 may be protected by the protecting structure. For example, the protecting structure may include epoxy and/or any other suitable material.

Figure 4:
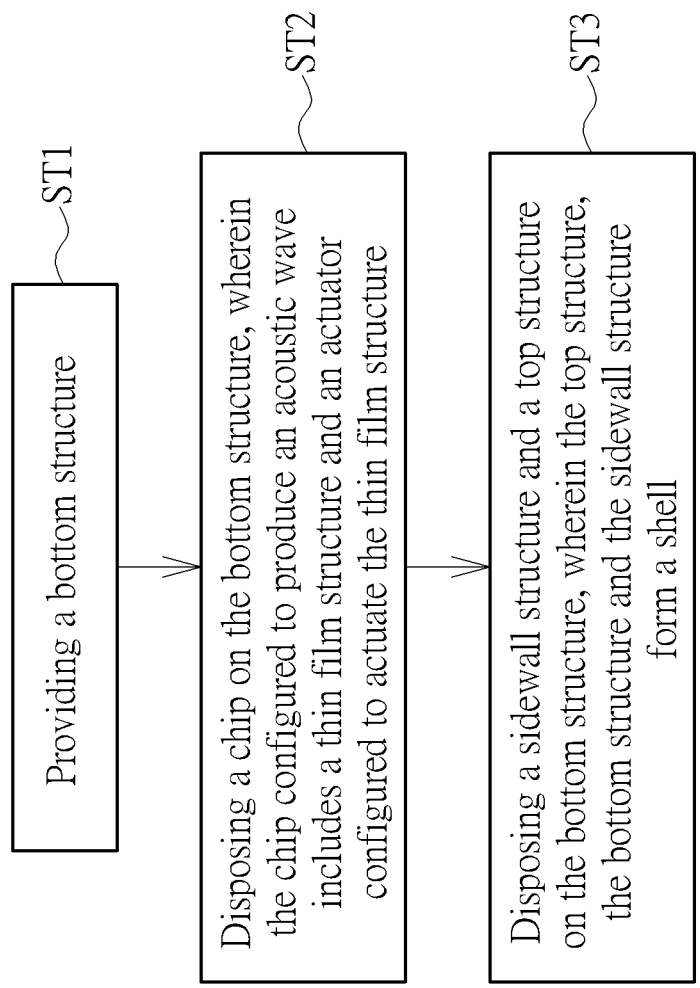
FIG. 4 is a flowchart of a manufacturing method of a sound producing package structure according to an embodiment of the present invention.

Referring to FIG. 4, FIG. 4 is a flowchart of a manufacturing method of a sound producing package structure according to an embodiment of the present invention. It is to be appreciated that the flowchart shown in FIG. 4 is exemplary. In some embodiments, some of the steps may be performed simultaneously, or in a different order than shown in FIG. 4. In some embodiments, before or after one of the existing steps of the manufacturing method shown in FIG. 4, any other suitable step may be added. Regarding the following contents, the manufacturing method shall be described with reference to FIG. 4. However, the manufacturing method is not limited to those example embodiments.

In a step ST1 of FIG. 4, the bottom structure BS (e.g., the base 110 in FIG. 1) is provided.

In a step ST2 of FIG. 4, the chip 120 configured to produce the acoustic wave is disposed on the bottom structure BS, wherein the chip 120 includes the thin film structure 122 and the actuator 124 configured to actuate the thin film structure 122. As shown in FIG. 1, the chip 120 may be disposed on and connected to the base 110 by the adhesive component(s) 160. Moreover, in FIG. 1, the integrated circuit chip 170 may be further disposed on and connected to the base 110 (i.e., the bottom structure BS) by the adhesive component(s) 162.

In this embodiment, as shown in FIG. 1, after the step ST2, the conductive wire 150 electrically connected between the first bonding pad BP1 of the chip 120 and the second bonding pad BP2 of the base 110 is formed. Also, the conductive wire 152 electrically connected between the third bonding pad BP3 of the integrated circuit chip 170 and the fourth bonding pad BP4 of the base 110 is formed. The conductive wires 150, 152 may be formed by any suitable process (e.g., the wire bonding process) and formed at any suitable position.

In a step ST3 of FIG. 4, the sidewall structure SWS and the top structure TS are disposed on the bottom structure BS, wherein the bottom structure BS is opposite to the top structure TS, and the sidewall structure SWS is between the top structure TS and the bottom structure BS, such that the top structure TS, the bottom structure BS and the sidewall structure SWS form a shell SL, and a chamber CB is formed in the shell SL. In FIG. 1, the cap 130 may serve as the sidewall structure(s) SWS and the top structure TS, and the cap 130 may be disposed on and connected to the base 110 through the adhesive component(s) 164.

According to the above steps, the chip 120 is inside the shell SL, and the thin film structure 122 of the chip 120 faces the top structure TS and the bottom structure BS. Furthermore, the chamber CB is separated into the first portion CB1 and the second portion CB2 by the thin film structure 122 of the chip 120, the sidewall structure SWS of the shell SL has the first opening OP1 connected to the first portion CM, the shell SL has the second opening OP2 connected to the second portion CB2, and the acoustic wave generated by the sound producing package structure 100 propagates outwards through one of the first opening OP1 or the second opening OP2.

Optionally, as shown in FIG. 1, the first mesh 140 covering the first opening OP1 may be formed before or after any suitable step. Optionally, as shown in FIG. 1, the second mesh 142 covering the second opening OP2 may be formed before or after any suitable step.

Due to the design of the sound producing package structure 100, the component in the sound producing package structure 100 (such as the chip 120, the connecting components CP and/or any other component) may be protected, so as to enhance the yield rate and the reliability. More particularly, the unintended physical and chemical damages on the connecting components CP and the chip 120 may be reduced when the sound producing package structure 100 is employed or when the sound producing package structure 100 is assembled in a product. Furthermore, the adverse impact of the dust and/or the liquid on the component in the sound producing package structure 100 is decreased.

On the other hand, in this embodiment, since the chip 120 is formed of the semiconductor process, and the sound producing package structure 100 may be formed of a semiconductor packaging process, the sound producing package structure 100 may be downsized (the lateral dimension of the sound producing package structure 100 may be smaller than or equal to, but not limited to, 10 mm×10 mm or 5 mm×5 mm) and the uniformity of the sound producing package structure 100 may be enhanced. Moreover, if at least one integrated circuit chip exists in this sound producing package structure 100, and one integrated circuit chip is served as the base 110, the sound producing package structure 100 may be downsized more.

The sound producing package structure and the manufacturing method of the sound producing package structure of the present invention are not limited by the above embodiments. Other embodiments of the present invention are described below. For ease of comparison, same components will be labeled with the same symbol in the following. The following descriptions relate the differences between each of the embodiments, and repeated parts will not be redundantly described.

Figure 5:
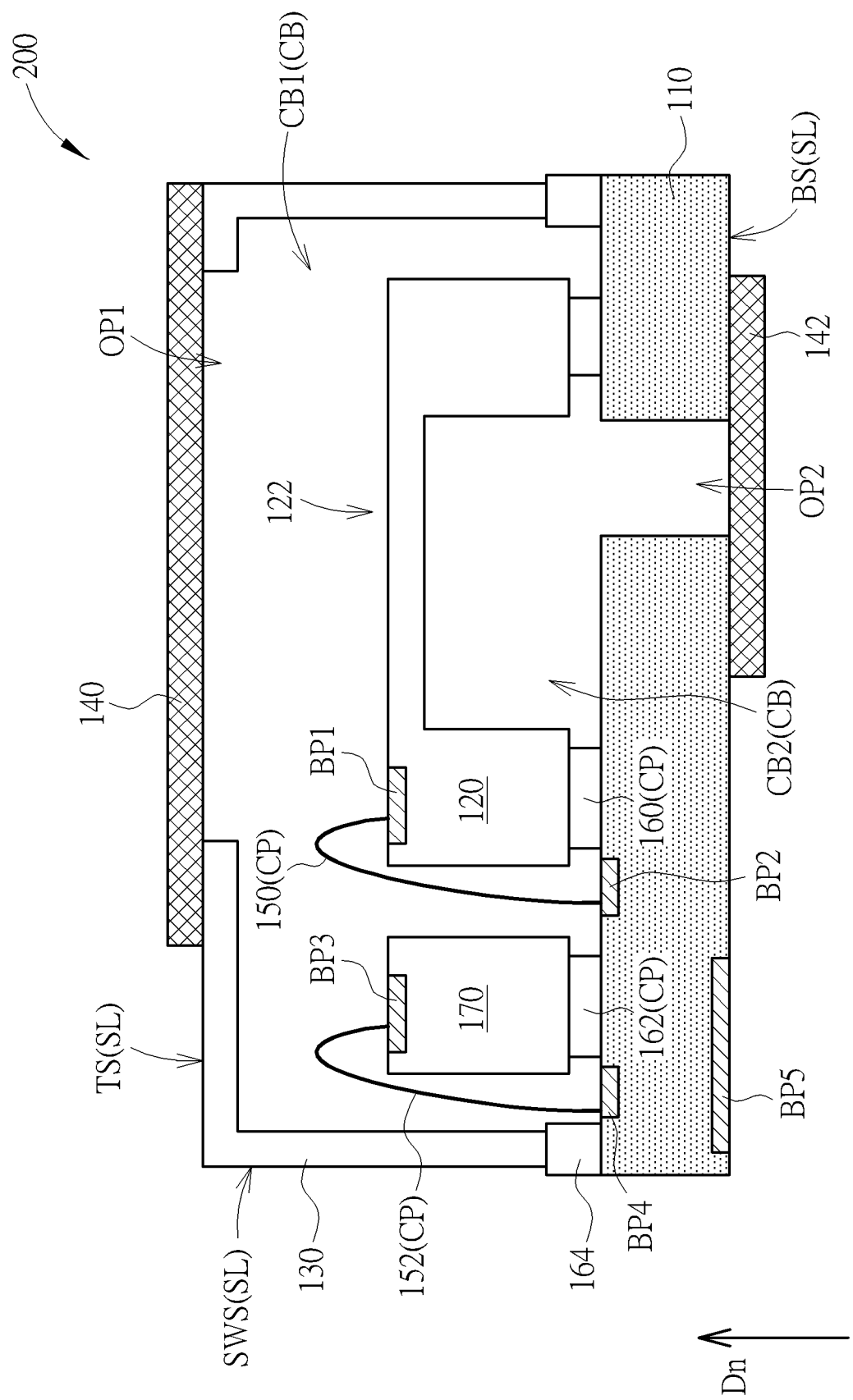
FIG. 5 is a schematic diagram of a cross-sectional view illustrating a sound producing package structure according to a second embodiment of the present invention.

Referring to FIG. 5, FIG. 5 is a schematic diagram of a cross-sectional view illustrating a sound producing package structure according to a second embodiment of the present invention. As shown in FIG. 5, a difference between this embodiment and the first embodiment is the position of the first opening OP1 of the sound producing package structure 200. In FIG. 5, the top part of the cap 130 (i.e., the top structure TS of the shell SL) may have the first opening OP1, but not limited thereto. Note that the structure of the sound producing package structure 200 of this embodiment shown in FIG. 5 is the same as the eighth embodiment of the U.S. application Ser. No. 16/699,078.

Figure 6:
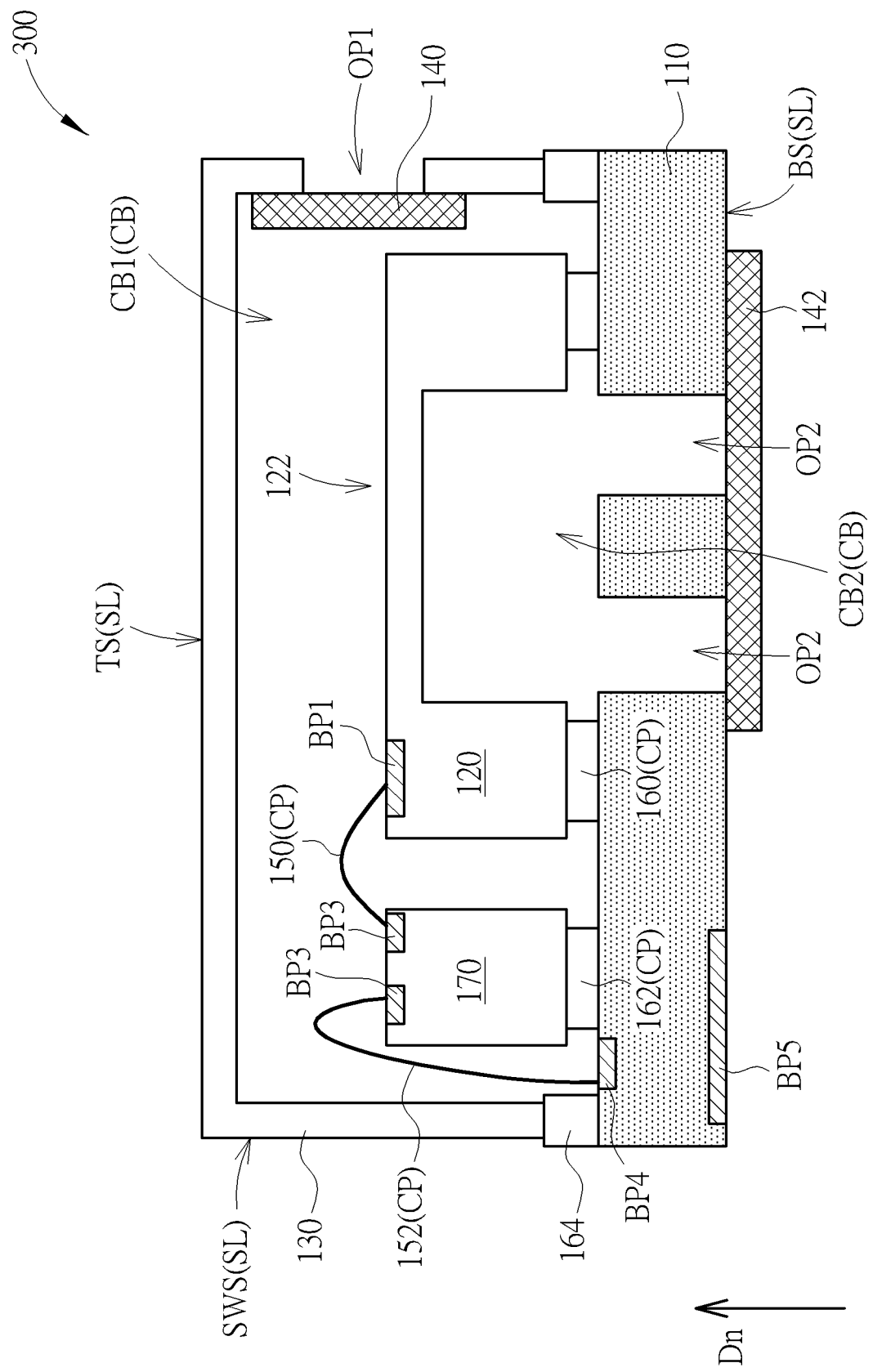
FIG. 6 is a schematic diagram of a cross-sectional view illustrating a sound producing package structure according to a third embodiment of the present invention.

Referring to FIG. 6, FIG. 6 is a schematic diagram of a cross-sectional view illustrating a sound producing package structure according to a third embodiment of the present invention. As shown in FIG. 6, a difference between this embodiment and the first embodiment is the disposition of the conductive wire 150 of the sound producing package structure 300. In FIG. 6, the conductive wire 150 (i.e., the connecting component CP) may be connected to (or in contact with) the first bonding pad BP1 of the chip 120 and another third bonding pad BP3 of the integrated circuit chip 170. That is to say, the conductive connecting component CP may be connected to (or in contact with) the chip 120 and the integrated circuit chip 170. Moreover, the conductive wire 150 (i.e., the connecting component CP) may be formed after disposing the chip 120 and the integrated circuit chip 170 (i.e., the conductive wire 150 may be formed after the step ST2 in FIG. 4).

Moreover, in FIG. 6, the first mesh 140 may be disposed inside the shell SL, but not limited thereto. In FIG. 6, the shell SL may have a plurality of second openings OP2, and the second mesh 142 may cover all of the second openings OP2, but not limited thereto.

Figure 7:
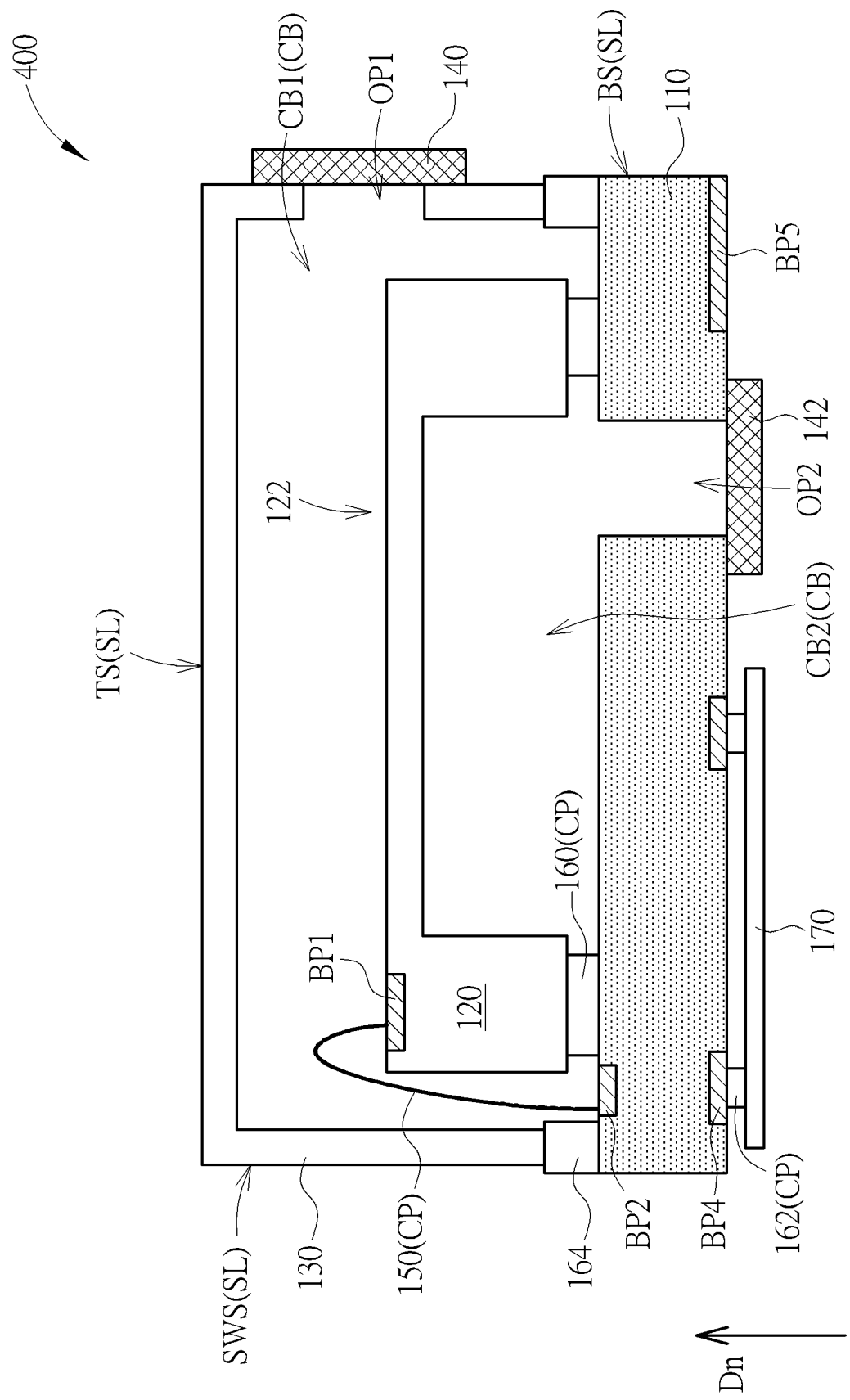
FIG. 7 is a schematic diagram of a cross-sectional view illustrating a sound producing package structure according to a fourth embodiment of the present invention.
Figure 8:
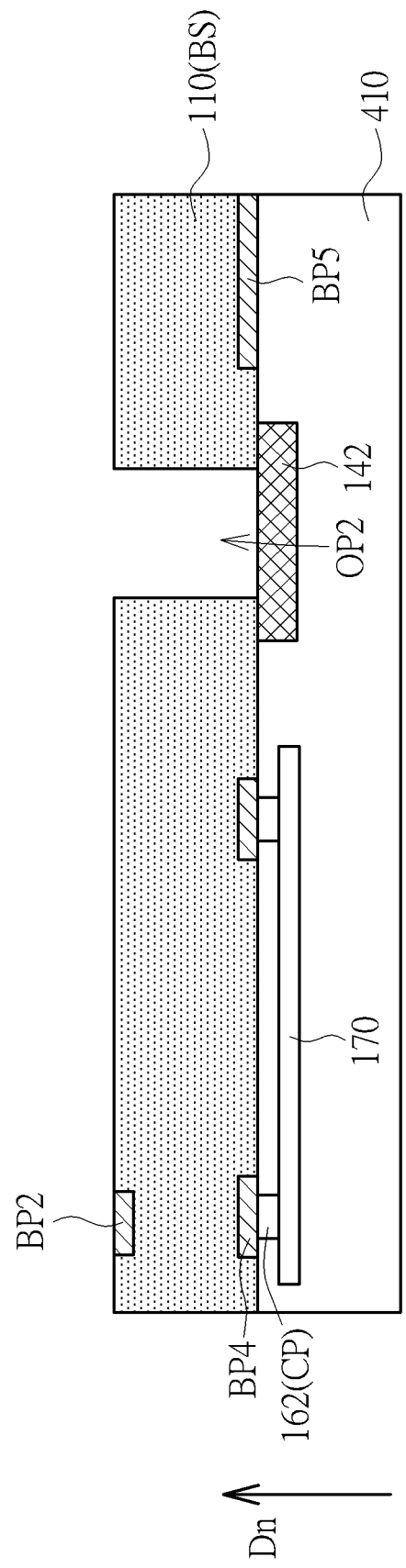
FIG. 8 to FIG. 10 are schematic diagrams illustrating structures at different stages of the manufacturing process of the sound producing package structure according to the fourth embodiment of the present invention.
Figure 9:
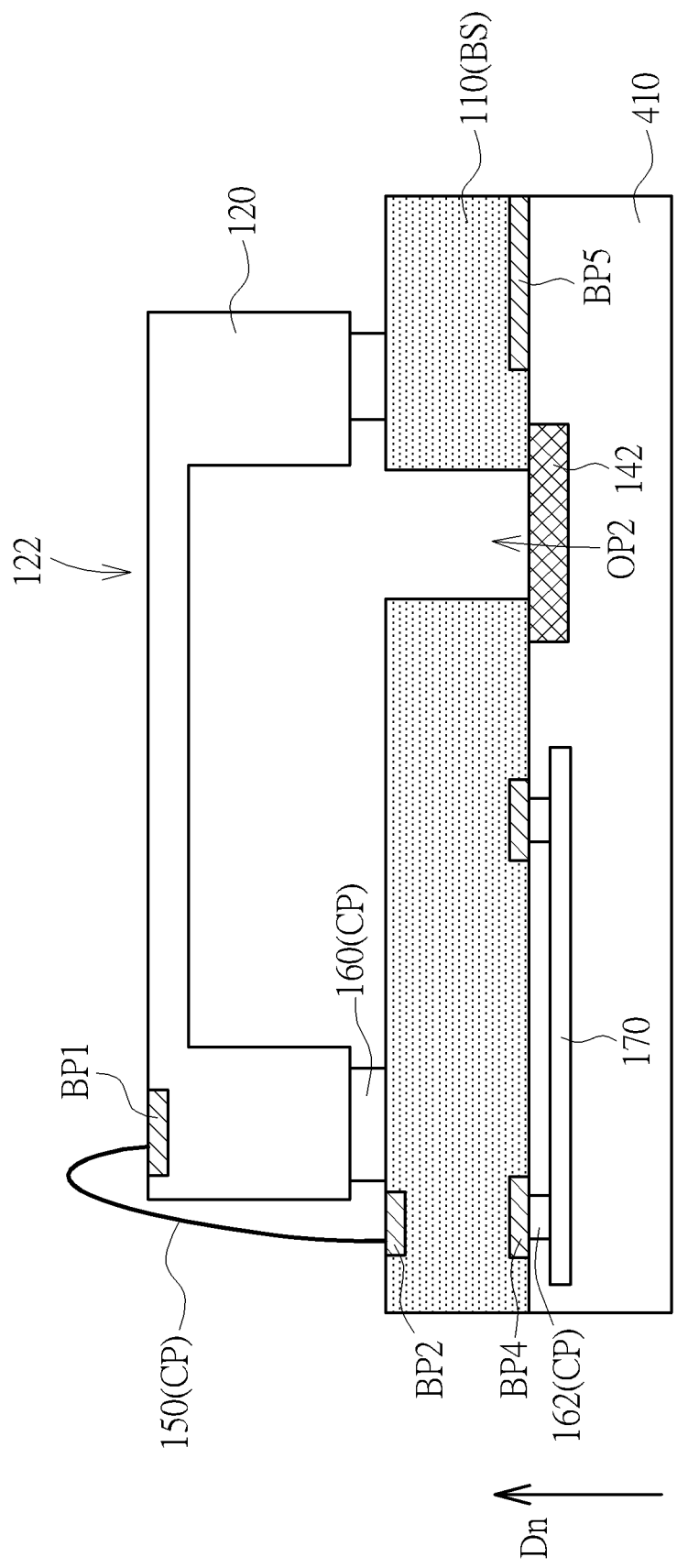
Figure 10:
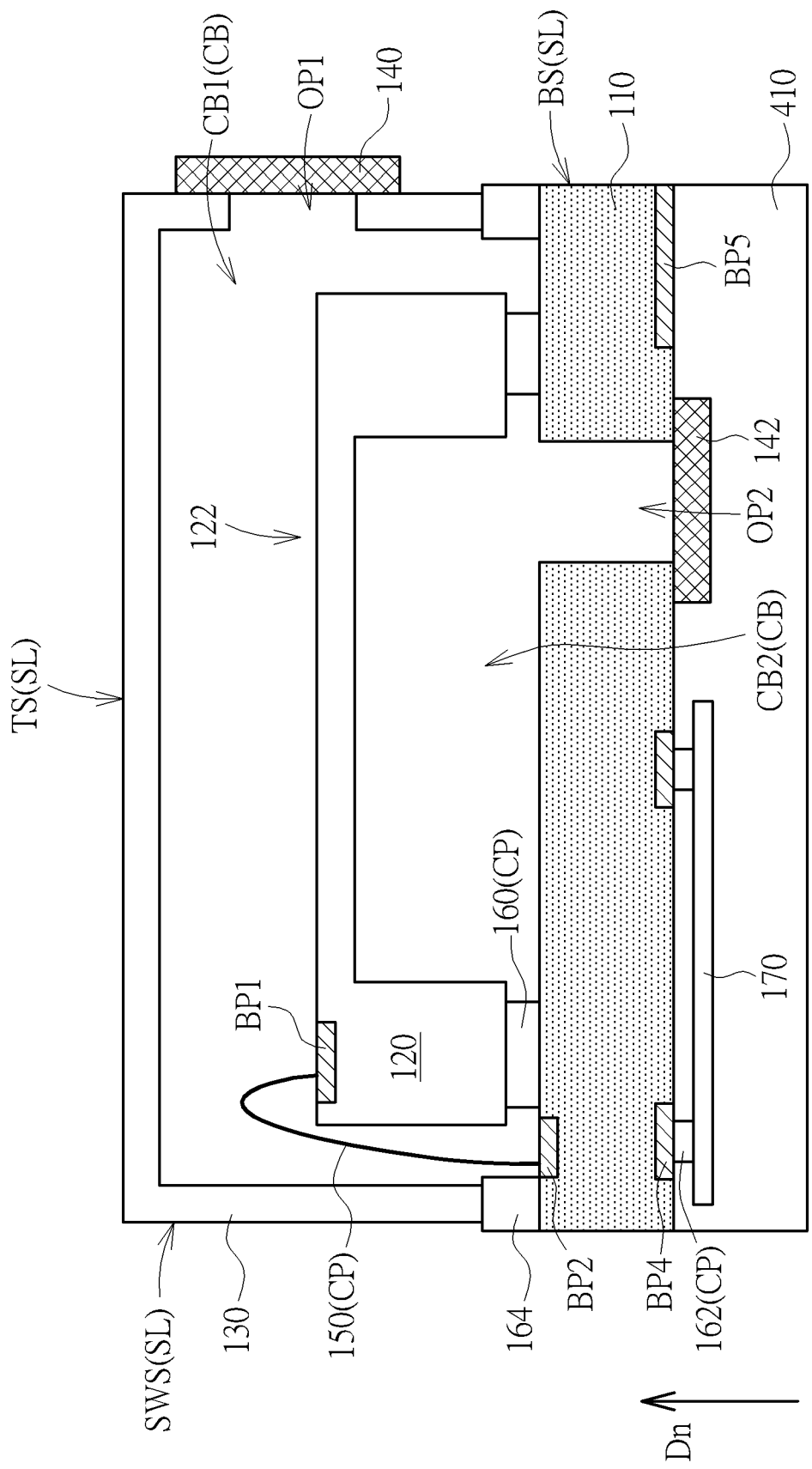

Referring to FIG. 7 to FIG. 10, FIG. 7 is a schematic diagram of a cross-sectional view illustrating a sound producing package structure according to a fourth embodiment of the present invention, and FIG. 8 to FIG. 10 are schematic diagrams illustrating structures at different stages of the manufacturing process of the sound producing package structure according to the fourth embodiment of the present invention. As shown in FIG. 7, a difference between this embodiment and the first embodiment is that the chip 120 and the integrated circuit chip 170 are disposed on opposite sides of the base 110 (i.e., the bottom structure BS of the shell SL). Namely, the integrated circuit chip 170 is disposed on the base 110 and outside the shell SL. Optionally, the integrated circuit chip 170 may overlap at least one electronic component in the normal direction Dn of the base 110 (i.e., the bottom structure BS of the shell SL), such that the lateral dimension of the sound producing package structure 400 may be downsized. For example, in FIG. 7, the chip 120 may overlap the integrated circuit chip 170 in the normal direction Dn of the base 110 (i.e., the bottom structure BS of the shell SL). Furthermore, in this embodiment, the integrated circuit chip 170 may be electrically connected to the base 110 through the conductive adhesive component 162 (i.e., the connecting component CP) disposed between the integrated circuit chip 170 and the base 110.

As shown in FIG. 4 and FIG. 7 to FIG. 10, the manufacturing method of the sound producing package structure 400 of this embodiment is shown. In the step ST1 of FIG. 4, the bottom structure BS (e.g., the base 110) is provided (as shown in FIG. 8). Then, in FIG. 8, the integrated circuit chip 170 and the conductive adhesive component 162 are disposed on the lower side of the base 110. Optionally, in FIG. 8, the second mesh 142 may be further disposed on the lower side of the base 110 and cover the second opening OP2 of the base 110.

In FIG. 8, the manufacturing method may further include a step, and this step forms a protecting layer 410 on the bottom structure BS (e.g., the base 110) to cover the integrated circuit chip 170. The protecting layer 410 is configured to protect the component(s) (such as the integrated circuit chip 170 and/or the second mesh 142) disposed on the lower side of the base 110, so as to reduce the damage on the component(s) due to the subsequent manufacturing step(s). In addition, the protecting layer 410 may further provide a flat lower surface, so as to advantage the subsequent manufacturing step(s).

In the step ST2 of FIG. 4, the chip 120 including the thin film structure 122 and the actuator 124 is disposed on the bottom structure BS (as shown in FIG. 9). In FIG. 9, the chip 120 may be disposed on the upper side of the base 110. Furthermore, in FIG. 9, after the step ST2, the conductive wire 150 electrically connected between the first bonding pad BP1 of the chip 120 and the second bonding pad BP2 of the base 110 is formed.

Then, in the step ST3 of FIG. 4, the sidewall structure SWS and the top structure TS are disposed on the bottom structure BS (as shown in FIG. 10), wherein the bottom structure BS is opposite to the top structure TS, and the sidewall structure SWS is between the top structure TS and the bottom structure BS, such that the top structure TS, the bottom structure BS and the sidewall structure SWS form the shell SL, and the chamber CB is formed in the shell SL. In FIG. 10, the cap 130 may serve as the sidewall structure(s) SWS and the top structure TS, and the cap 130 may be disposed on and connected to the base 110 through the adhesive component(s) 164.

According to the above, as shown in FIG. 8 and FIG. 10, the integrated circuit chip 170 is disposed on the bottom structure BS before disposing the chip 120 on the bottom structure BS and disposing the sidewall structure SWS and the top structure TS on the bottom structure BS. As shown in FIG. 8 and FIG. 10, the protecting layer 410 is formed on the bottom structure BS to cover the integrated circuit chip 170 after disposing the integrated circuit chip 170 on the bottom structure BS and before disposing the chip 120 on the bottom structure BS and disposing the sidewall structure SWS and the top structure TS on the bottom structure BS.

Optionally, as shown in FIG. 10, the first mesh 140 covering the first opening OP1 may be formed before or after any suitable step.

Next, the protecting layer 410 may be removed, such that the manufacture of the sound producing package structure 400 is completed (as shown in FIG. 7).

Figure 11:
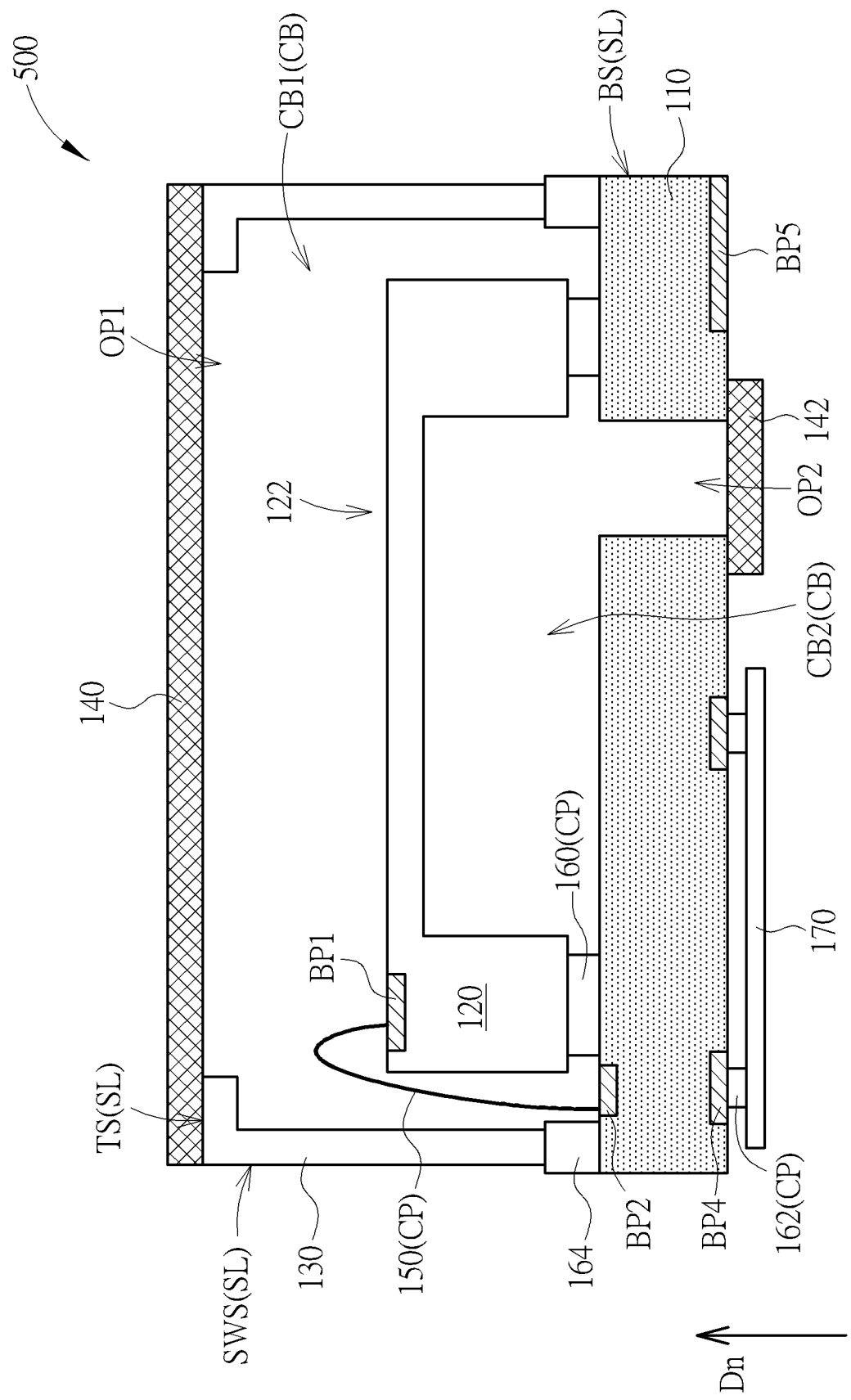
FIG. 11 is a schematic diagram of a cross-sectional view illustrating a sound producing package structure according to a fifth embodiment of the present invention.

Referring to FIG. 11, FIG. 11 is a schematic diagram of a cross-sectional view illustrating a sound producing package structure according to a fifth embodiment of the present invention. As shown in FIG. 11, a difference between this embodiment and the fourth embodiment is the position of the first opening OP1 of the sound producing package structure 500. In FIG. 11, the top part of the cap 130 (i.e., the top structure TS of the shell SL) may have the first opening OP1, but not limited thereto. Note that the structure of the sound producing package structure 500 of this embodiment shown in FIG. 11 is the same as the ninth embodiment of the U.S. application Ser. No. 16/699,078.

Figure 12:
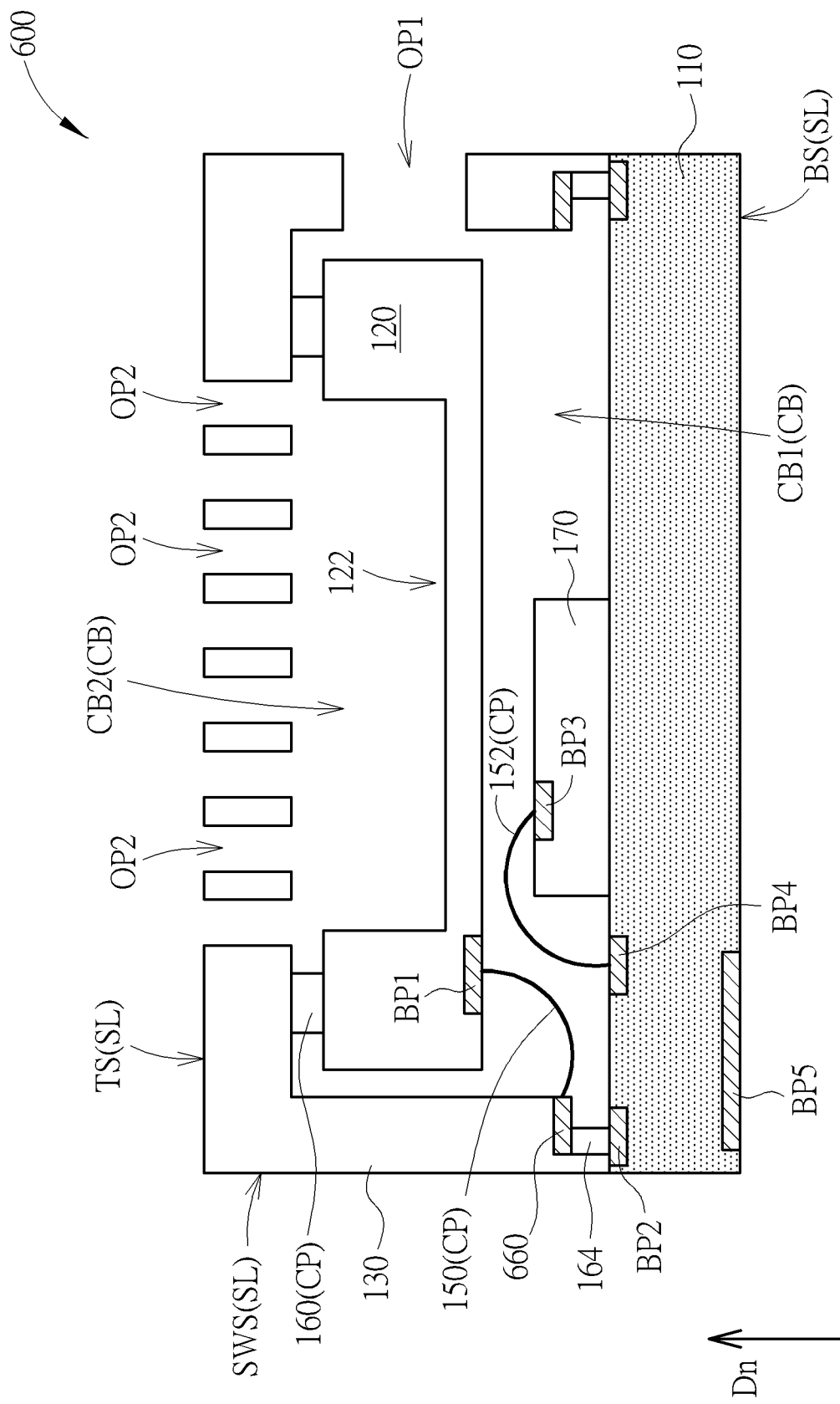
FIG. 12 is a schematic diagram of a cross-sectional view illustrating a sound producing package structure according to a sixth embodiment of the present invention.
Figure 13:
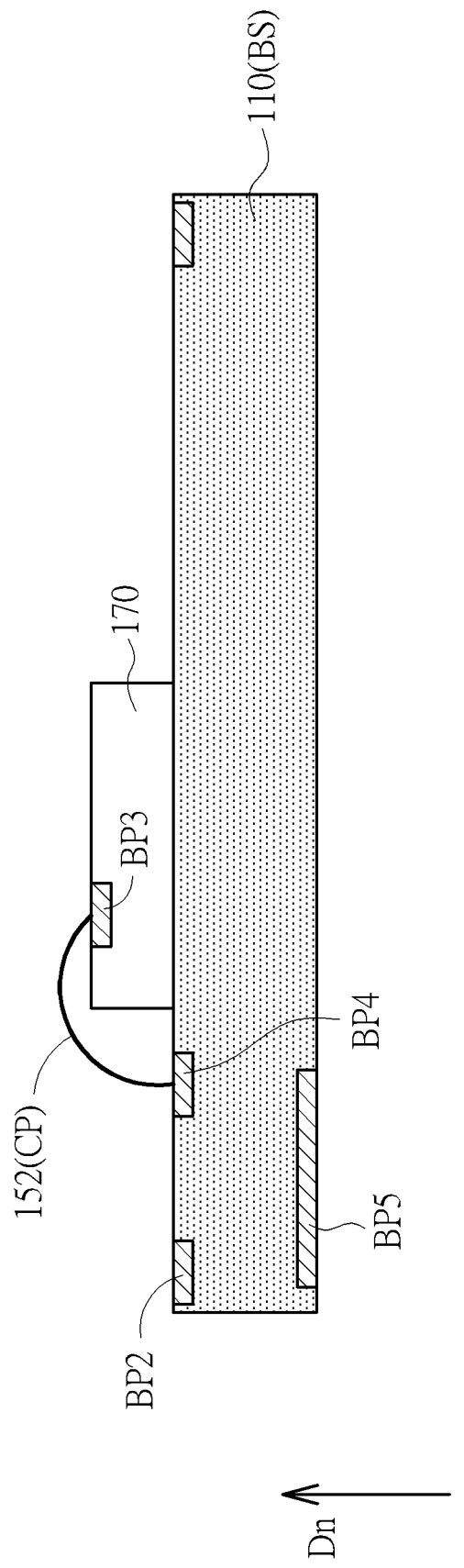
FIG. 13 to FIG. 14 are schematic diagrams illustrating structures at different stages of the manufacturing process of the sound producing package structure according to the sixth embodiment of the present invention.
Figure 14:
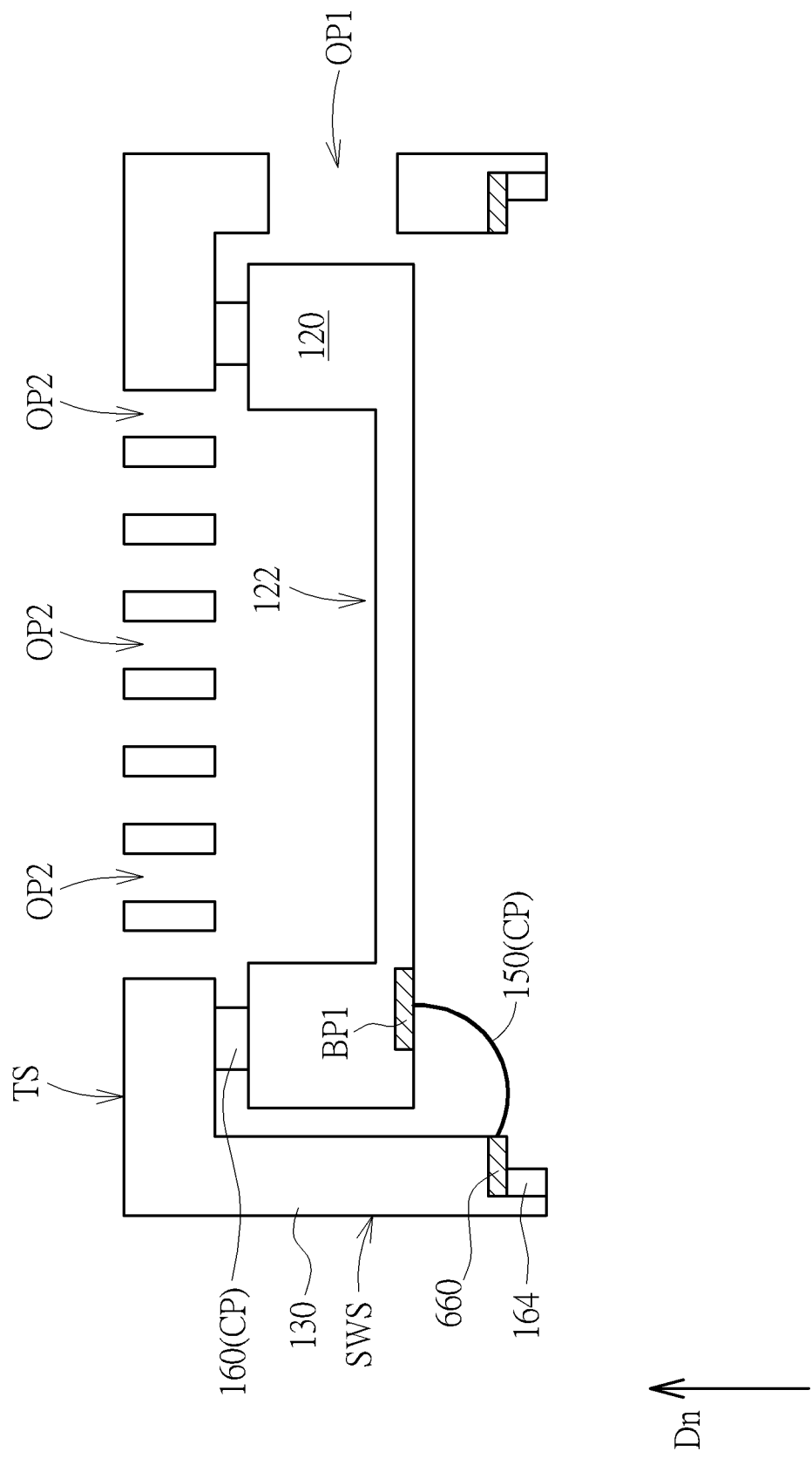

Referring to FIG. 12 to FIG. 14, FIG. 12 is a schematic diagram of a cross-sectional view illustrating a sound producing package structure according to a sixth embodiment of the present invention, and FIG. 13 to FIG. 14 are schematic diagrams illustrating structures at different stages of the manufacturing process of the sound producing package structure according to the sixth embodiment of the present invention. As shown in FIG. 12, a difference between this embodiment and the first embodiment is that the disposition of the chip 120 of the sound producing package structure 600. The chip 120 is disposed on the base 110 (i.e., the bottom structure BS of the shell SL), and the chip 120 is connected to the top part of the cap 130 (i.e., the top structure TS of the shell SL) through the adhesive component 160 therebetween, wherein the adhesive component 160 may include an insulating material and/or a conductive material. For instance, the adhesive component 160 may include the insulating material, the chip 120 may be electrically connected to a conductive structure 660 of the cap 130 through the conductive wire 150, and the conductive structure 660 of the cap 130 is electrically connected to the second bonding pad BP2 of the base 110 through the adhesive component 160 which is conductive, but not limited thereto. Note that the conductive structure 660 of the cap 130 may be designed to any other suitable type based on requirement(s).

For another instance, a conductive structure may be included in the top part of the cap 130, and the first bonding pad BP1 of the chip 120 may be electrically connected to the conductive structure of the top part of the cap 130 through the adhesive component 160 which is conductive (e.g., the flip chip package), such that the chip 120 may be electrically connected to the base 110 through the first bonding pad BP1 of the chip 120, the conductive adhesive component 160, the conductive structure of the cap 130, a trace in the cap 130, the conductive adhesive component 164 and the second bonding pad BP2 of the base 110, but not limited thereto. For another instance, the cap 130 may have a bonding pad connected to the outer device, and the chip 120 may be electrically connected to this bonding pad through the first bonding pad BP1 of the chip 120, the conductive adhesive component 160, the conductive structure of the cap 130 and a trace in the cap 130, so as to be electrically connected to the outer device.

Optionally, the integrated circuit chip 170 may overlap at least one electronic component in the normal direction Dn of the base 110 (i.e., the bottom structure BS of the shell SL), such that the lateral dimension of the sound producing package structure 600 may be downsized. For example, in FIG. 12, the chip 120 may overlap the integrated circuit chip 170 in the normal direction Dn of the base 110 (i.e., the bottom structure BS of the shell SL).

Another difference between this embodiment and the first embodiment is the dispositions of the openings of the sound producing package structure 600. In FIG. 12, the sidewall of the cap 130 (i.e., the sidewall structure SWS of the shell SL) may have the first opening(s) OP1, the top part of the cap 130 (i.e., the top structure TS of the shell SL) may have the second opening(s) OP2, and the thin film structure 122 of the chip 120 may overlap the second opening(s) OP2 in the normal direction Dn of the base 110, but not limited thereto. Thus, the first portion CB1 of the chamber CB may be between the thin film structure 122 and the base 110 (i.e., the bottom structure BS of the shell SL), and the second portion CB2 of the chamber CB may be between the thin film structure 122 and the top part of the cap 130 (i.e., the top structure TS of the shell SL), but not limited thereto.

As shown in FIG. 4 and FIG. 12 to FIG. 14, the manufacturing method of the sound producing package structure 600 of this embodiment is shown. In the step ST1 of FIG. 4, the bottom structure BS (e.g., the base 110) is provided (as shown in FIG. 13). Then, in FIG. 13, the integrated circuit chip 170 and the conductive wire 152 are disposed on the base 110.

In FIG. 14, the cap 130 (i.e., the sidewall structure SWS and the top structure TS) is provided, and the chip 120 and the cap 130 are connected to each other through the adhesive component 160, wherein the chip 120 may be connected to the sidewall or the top part of the cap 130 (i.e., the sidewall structure SWS or the top structure TS). Furthermore, the electrical connection (e.g., the conductive wire 150) between the cap 130 and the chip 120 may be formed.

Then, in the steps ST2 and ST3 of FIG. 4 (the structure is shown in FIG. 12), the chip 120, the sidewall structure SWS (i.e., the sidewall of the cap 130) and the top structure TS (i.e., the top part of the cap 130) are disposed on the bottom structure BS (i.e., the base 110). More precisely, the cap 130 and the chip 120 are disposed on the base 110 at the same time. According to the above, before disposing the chip 120 on the bottom structure BS (i.e., the base 110) and disposing the sidewall structure SWS (i.e., the sidewall of the cap 130) and the top structure TS (i.e., the top part of the cap 130) on the bottom structure BS (i.e., the base 110), the chip 120 is connected to the sidewall structure SWS or the top structure TS through the connecting component CP (i.e., the adhesive component 160).

Optionally, the first mesh 140 and/or the second mesh 142 may be formed.

Figure 15:
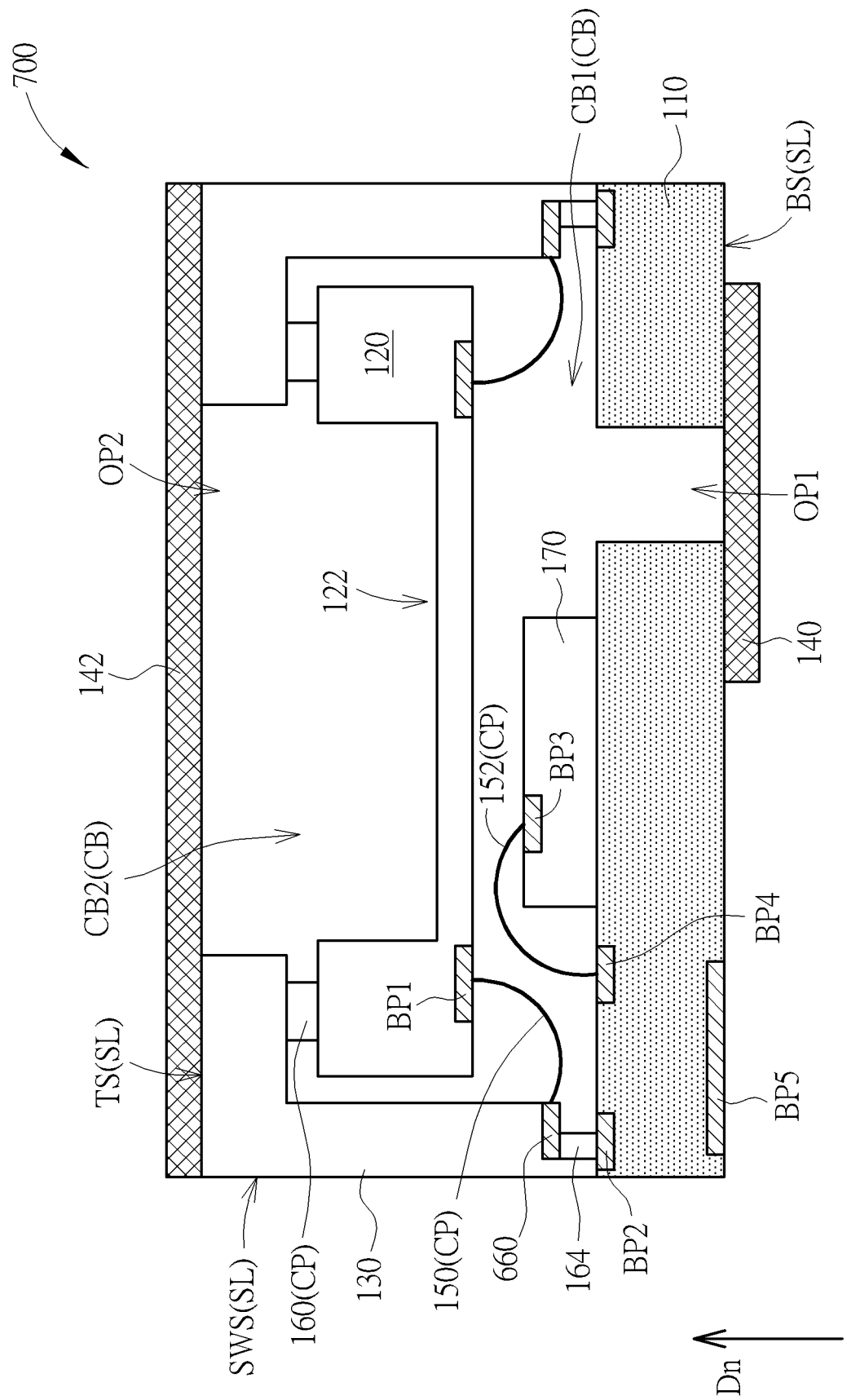
FIG. 15 is a schematic diagram of a cross-sectional view illustrating a sound producing package structure according to a seventh embodiment of the present invention.

Referring to FIG. 15, FIG. 15 is a schematic diagram of a cross-sectional view illustrating a sound producing package structure according to a seventh embodiment of the present invention. As shown in FIG. 15, a difference between this embodiment and the sixth embodiment is the dispositions of the openings of the sound producing package structure 700. In FIG. 15, the base 110 (i.e., the bottom structure BS of the shell SL) may have the first opening OP1, but not limited thereto. Note that the structure of the sound producing package structure 700 of this embodiment shown in FIG. 15 is the same as the tenth embodiment of the U.S. application Ser. No. 16/699,078.

Referring to FIG. 16, FIG. 16 is a schematic diagram of a cross-sectional view illustrating a sound producing package structure according to an eighth embodiment of the present invention. As shown in FIG. 16, a difference between this embodiment and the first embodiment is the design of the top structure TS and the sidewall structure SWS of the shell SL of the sound producing package structure 800. The top structure TS and the sidewall structure(s) SWS are different components, and the sidewall structure SWS is connected to the top structure TS and the bottom structure BS by an adhesive material. For example, the bottom structure BS, the top structure TS and the sidewall structure SWS are different substrates, but not limited thereto. The substrate may be a hard substrate or a flexible substrate, and the substrate may optionally include conductive layer to be a circuit board.

Another difference between this embodiment and the first embodiment is that the disposition of the integrated circuit chip 170 of the sound producing package structure 800. The integrated circuit chip 170 may be connected to top structure TS of the shell SL through the adhesive component 162. Optionally, the integrated circuit chip 170 may overlap at least one electronic component in the normal direction Dn of the base 110 (i.e., the bottom structure BS of the shell SL), such that the lateral dimension of the sound producing package structure 800 may be downsized. For example, in FIG. 16, the chip 120 may overlap the integrated circuit chip 170 in the normal direction Dn of the base 110 (i.e., the bottom structure BS of the shell SL).

Moreover, the sidewall structure SWS may optionally include at least one connecting trace 810, the connecting trace 810 may be electrically connected to a conductive component disposed on the bottom structure BS or in the bottom structure BS, and the connecting trace 810 may be electrically connected to another conductive component disposed on the top structure TS or in the top structure TS. For example, as shown in FIG. 16, the connecting trace 810 may be connected between the fourth bonding pad BP4 of the top structure TS and the fifth bonding pad BP5 of the bottom structure BS (i.e., the base 110), but not limited thereto. In this case, the adhesive material between the bottom structure BS and the sidewall structure SWS and/or the adhesive material between the top structure TS and the sidewall structure SWS may be conductive, but not limited thereto. Thus, in some embodiments, only one of the top structure TS or the bottom structure BS may have the bonding pad connected to the outer device (e.g., in FIG. 16, the bottom structure BS has the fifth bonding pad BP5 connected to the outer device, and the top structure TS does not have the bonding pad connected to the outer device), but not limited thereto.

Furthermore, the integrated circuit chip 170 and the chip 120 may be disposed by such as the flip chip package. Therefore, the adhesive components 160, 162 may be conductive, the adhesive component 160 may be between and in contact with the first bonding pad BP1 of the chip 120 and the second bonding pad BP2 of the bottom structure BS, and the adhesive component 162 may be between and in contact with the third bonding pad BP3 of the integrated circuit chip 170 and the fourth bonding pad BP4 of the top structure TS of the shell SL.

In the manufacturing method of the sound producing package structure 800, as shown in FIG. 16, the integrated circuit chip 170 may be connected to the sidewall structure SWS or the top structure TS through the adhesive component 162 (i.e., the connecting component CP) before disposing the integrated circuit chip 170 on the bottom structure BS and disposing the sidewall structure SWS and the top structure TS on the bottom structure BS, but not limited thereto.

Optionally, another difference between this embodiment and the first embodiment is that the sound producing package structure 800 further includes at least one passive component 820 disposed in the shell SL. In some embodiments, the passive component 820 may be electrically connected to the chip 120, the integrated circuit chip 170 and/or the outer device. For example, the passive component 820 may be a resistor, a capacitor or any other suitable electronic passive component 820, but not limited thereto.

Optionally, another difference between this embodiment and the first embodiment is the dispositions of the openings of the sound producing package structure 800. In FIG. 16, the top structure TS may have the first opening OP1, but not limited thereto. In FIG. 16, the bottom structure BS of the shell SL may have a plurality of second openings OP2, but not limited thereto.

Figure 17:
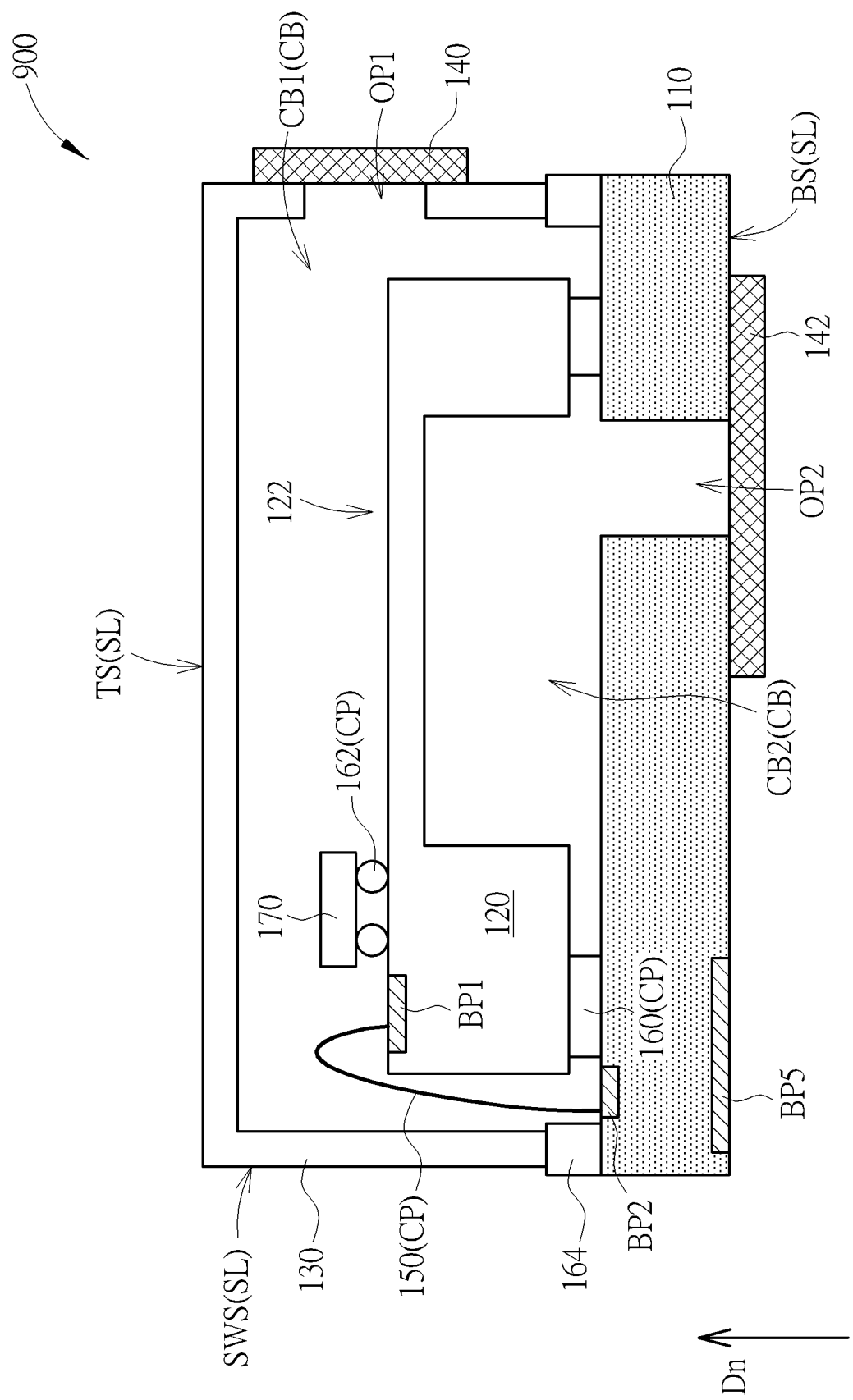
FIG. 17 is a schematic diagram of a cross-sectional view illustrating a sound producing package structure according to a ninth embodiment of the present invention.

Referring to FIG. 17, FIG. 17 is a schematic diagram of a cross-sectional view illustrating a sound producing package structure according to a ninth embodiment of the present invention. As shown in FIG. 17, a difference between this embodiment and the first embodiment is the disposition of the integrated circuit chip 170 of the sound producing package structure 900. The integrated circuit chip 170 is disposed on and connected to the chip 120 through the adhesive component 162 (i.e., the connecting component CP). Namely, the adhesive component 162 (i.e., the connecting component CP) is between the integrated circuit chip 170 and the chip 120 in the normal direction Dn of the base 110 (i.e., the bottom structure BS of the shell SL), and the adhesive component 162 is in contact with the chip 120 and the integrated circuit chip 170. Thus, in FIG. 17, the chip 120 overlaps the integrated circuit chip 170, so as to downsize the lateral dimension of the sound producing package structure 900.

In the embodiment shown in FIG. 17, since the integrated circuit chip 170 may be disposed by such as the flip chip package, the adhesive component 162 may be conductive, and the integrated circuit chip 170 may be electrically connected to the chip 120 through the adhesive component 162, but not limited thereto. In another embodiment, the integrated circuit chip 170 may be electrically connected to the chip 120 through the conductive wire (not shown in FIG. 17), but not limited thereto.

In the manufacturing method of the sound producing package structure 900, as shown in FIG. 17, the integrated circuit chip 170 may be disposed on the chip 120 through the adhesive component 162 (i.e., the connecting component CP) before or after disposing the chip 120 on the base 110 (i.e., the bottom structure BS).

Figure 18:
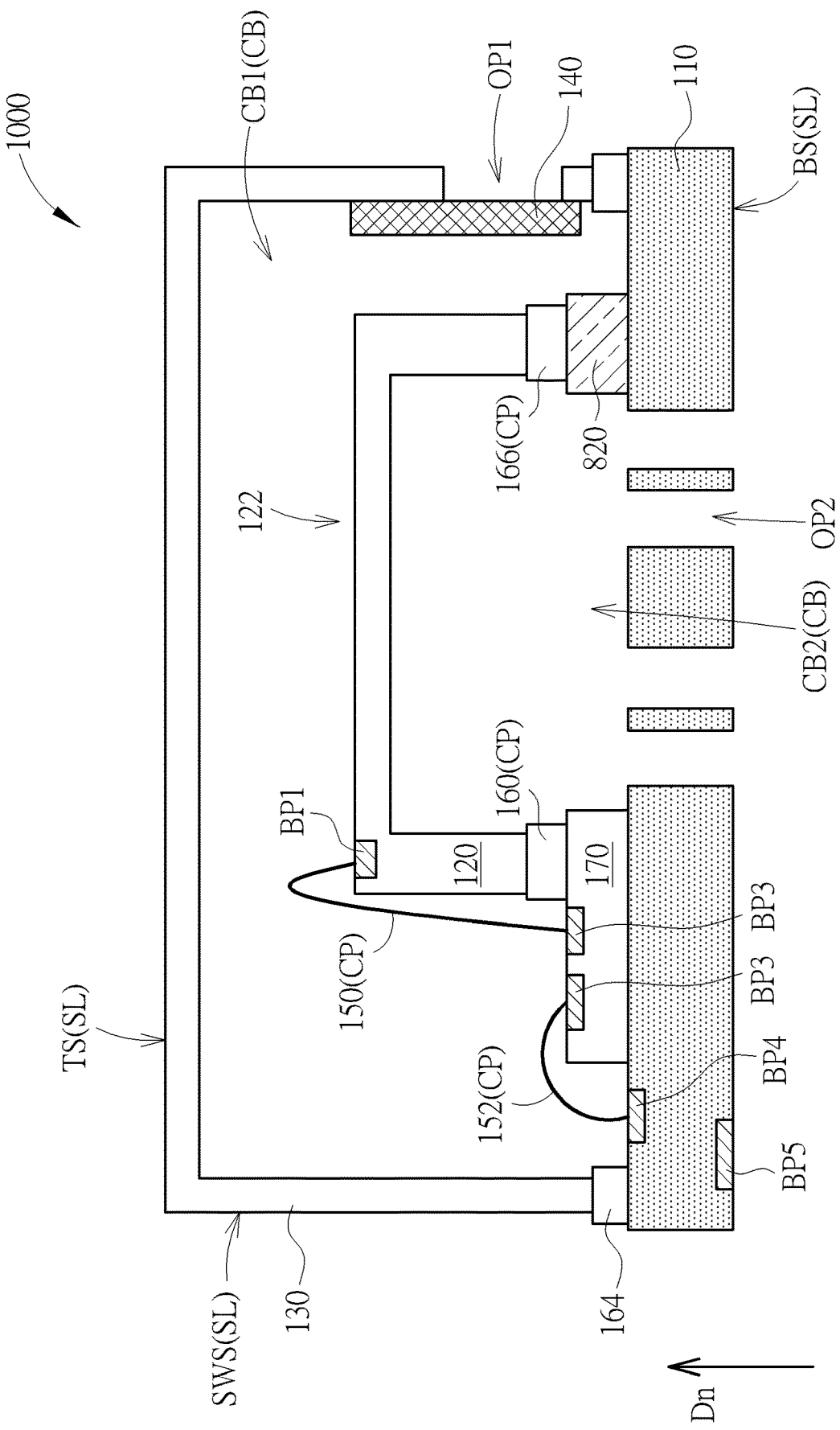
FIG. 18 is a schematic diagram of a cross-sectional view illustrating a sound producing package structure according to a tenth embodiment of the present invention.

Referring to FIG. 18, FIG. 18 is a schematic diagram of a cross-sectional view illustrating a sound producing package structure according to a tenth embodiment of the present invention. As shown in FIG. 18, a difference between this embodiment and the first embodiment is the disposition of the chip 120 of the sound producing package structure 1000. The chip 120 is disposed on and connected to the integrated circuit chip 170 through the adhesive component 160 (i.e., the connecting component CP). Namely, the adhesive component 160 (i.e., the connecting component CP) is between the integrated circuit chip 170 and the chip 120 in the normal direction Dn of the base 110 (i.e., the bottom structure BS of the shell SL), and the adhesive component 160 is in contact with the chip 120 and the integrated circuit chip 170. Thus, in FIG. 18, the chip 120 overlaps the integrated circuit chip 170, so as to downsize the lateral dimension of the sound producing package structure 1000.

In the embodiment shown in FIG. 18, the chip 120 may be electrically connected to the integrated circuit chip 170 through the conductive wire 150, but not limited thereto. In some embodiments, the chip 120 may be disposed by such as the flip chip package, such that the adhesive component 160 may be conductive, and the chip 120 may be electrically connected to the integrated circuit chip 170 through the adhesive component 160, but not limited thereto.

Another difference between this embodiment and the first embodiment is that the sound producing package structure 1000 further includes at least one passive component 820 and another adhesive component 166 (i.e., another of the connecting components CP) disposed in the shell SL. The passive component 820 may be between the chip 120 and the base 110 (i.e., the bottom structure BS of the shell SL), and the adhesive component 166 may be in contact with the chip 120 and the passive component 820. In some embodiments, the passive component 820 may be electrically connected to the chip 120, the integrated circuit chip 170 and/or the outer device. For example, the passive component 820 may be a resistor, a capacitor or any other suitable electronic passive component 820, but not limited thereto.

Optionally, as shown in FIG. 18, since the passive component 820 and the integrated circuit chip 170 are between the base 110 and the chip 120, and the passive component 820 and the integrated circuit chip 170 are disposed at different positions on the base 110, the top surface of the integrated circuit chip 170 and the top surface of the passive component 820 may be in the same plane. For instance, the height of the integrated circuit chip 170 may be the same as the height of the passive component 820, but not limited thereto.

In the manufacturing method of the sound producing package structure 1000, as shown in FIG. 18, the passive component 820 and the integrated circuit chip 170 may be disposed on the base 110 (i.e., the bottom structure BS) before disposing the chip 120 on the base 110 and disposing the cap 130 (i.e., the sidewall structure SWS and the top structure TS) on the base 110. Then, the chip 120 may be disposed on the passive component 820 and the integrated circuit chip 170 before disposing the cap 130 (i.e., the sidewall structure SWS and the top structure TS) on the base 110, but not limited thereto.

In addition, the conductive wires 150, 152 shown in FIG. 18 may be formed before or after any suitable step. For example, the conductive wires 150, 152 may be formed after the chip 120 is disposed on the passive component 820 and the integrated circuit chip 170, but not limited thereto.

In summary, due to the present invention, the yield rate, the reliability and the uniformity of the sound producing package structure is enhanced, the adverse impact of the dust and/or the liquid on the component in the package structure is decreased, and the sound producing package structure is downsized.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sound producing package structure, comprising:
    a shell comprising a top structure, a bottom structure and a sidewall structure;
    a chip, disposed inside the shell and configured to produce an acoustic wave, wherein the chip comprises a thin film structure and an actuator configured to actuate the thin film structure, and the thin film structure is substantially parallel to the top structure and the bottom structure;
    an integrated circuit chip; and
    an electronic passive component coupled to the integrated circuit chip;
    wherein a first opening is formed on the sidewall structure, and the acoustic wave propagates outwards through the first opening;
    wherein one wave of the acoustic wave is reproduced by a plurality of air pulses, and a pulse rate of the air pulses is higher than a maximum human audible frequency.

2. The sound producing package structure of claim 1, wherein the chip overlaps the integrated circuit chip in a normal direction of the bottom structure of the shell.

3. The sound producing package structure of claim 1, wherein the chip and the integrated circuit chip are disposed on opposite sides of the bottom structure of the shell.

4. The sound producing package structure of claim 1, further comprising a connecting component in contact with the chip and the integrated circuit chip.

5. The sound producing package structure of claim 4, wherein the connecting component is between the chip and the integrated circuit chip in a normal direction of the bottom structure of the shell.

6. The sound producing package structure of claim 5, further comprising another connecting component in contact with the chip and the electronic passive component, wherein the electronic passive component and the integrated circuit chip are between the bottom structure of the shell and the chip.

7. The sound producing package structure of claim 4, wherein the connecting component is conductive.

8. The sound producing package structure of claim 1, wherein a top area of the top structure is larger than a side area of the sidewall structure.

9. The sound producing package structure of claim 1, wherein the sidewall structure comprises a connecting trace, the connecting trace is electrically connected to a conductive component disposed on the bottom structure or in the bottom structure, and the connecting trace is electrically connected to another conductive component disposed on the top structure or in the top structure.

10. The sound producing package structure of claim 1, further comprising a first mesh covering the first opening.

11. The sound producing package structure of claim 1, wherein the actuator comprises a piezoelectric actuator, an electrostatic actuator, an electromagnetic actuator or an electrothermal actuator.

12. The sound producing package structure of claim 1, wherein the integrated circuit chip or the electronic passive component is disposed on the bottom structure of the shell.

13. The sound producing package structure of claim 1, wherein the electronic passive component and the integrated circuit chip are between the bottom structure of the shell and the chip.

14. A manufacturing method of a sound producing package structure, comprising:
providing a bottom structure;
disposing an integrated circuit chip;
disposing an electronic passive component coupled to the integrated circuit chip;
disposing a chip on the bottom structure, wherein the chip configured to produce an acoustic wave comprises a thin film structure and an actuator configured to actuate the thin film structure; and
disposing a sidewall structure and a top structure on the bottom structure, wherein the top structure, the bottom structure and the sidewall structure form a shell;
wherein the chip is inside the shell, the thin film structure of the chip is substantially parallel to the top structure and the bottom structure, a first opening is formed on the sidewall structure, and the acoustic wave propagates outwards through the first opening;
wherein one wave of the acoustic wave is reproduced by a plurality of air pulses, and a pulse rate of the air pulses is higher than a maximum human audible frequency.

15. The manufacturing method of claim 14, wherein the chip and the integrated circuit chip are disposed on opposite sides of the bottom structure, and the integrated circuit chip is disposed on the bottom structure before disposing the chip on the bottom structure and disposing the sidewall structure and the top structure on the bottom structure, and the manufacturing method further comprises:
forming a protecting layer on the bottom structure to cover the integrated circuit chip after disposing the integrated circuit chip on the bottom structure and before disposing the chip on the bottom structure and disposing the sidewall structure and the top structure on the bottom structure.

16. The manufacturing method of claim 14, wherein before disposing the integrated circuit chip on the bottom structure and disposing the sidewall structure and the top structure on the bottom structure, the manufacturing method further comprises:
connecting the integrated circuit chip to the sidewall structure or the top structure through a connecting component.

17. The manufacturing method of claim 14, further comprising:
forming a connecting component in contact with the chip and the integrated circuit chip.

18. The manufacturing method of claim 17, wherein the integrated circuit chip is disposed on the chip through the connecting component before or after disposing the chip on the bottom structure.

19. The manufacturing method of claim 17,
wherein the integrated circuit chip and the electronic passive component are disposed on the bottom structure before disposing the chip on the bottom structure and disposing the sidewall structure and the top structure on the bottom structure, the chip is disposed on the electronic passive component and the integrated circuit chip before disposing the sidewall structure and the top structure on the bottom structure, and the chip is connected to the electronic passive component by another connecting component.

20. The manufacturing method of claim 14, wherein before disposing the chip on the bottom structure and disposing the sidewall structure and the top structure on the bottom structure, the manufacturing method further comprises:
connecting the chip to the sidewall structure or the top structure through a connecting component.

* * * * *